(12) United States Patent
Ang et al.

(10) Patent No.: US 12,191,810 B2
(45) Date of Patent: *Jan. 7, 2025

(54) MULTI-RESONANT OSCILLATOR/CLOCK

(71) Applicant: Analog Bits Inc., Sunnyvale, CA (US)

(72) Inventors: Michael A. Ang, San Francisco, CA (US); Alan C. Rogers, Sunnyvale, CA (US)

(73) Assignee: Analog Bits Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/507,973

(22) Filed: Nov. 13, 2023

(65) Prior Publication Data

US 2024/0120881 A1 Apr. 11, 2024

Related U.S. Application Data

(63) Continuation of application No. 17/955,975, filed on Sep. 29, 2022, now Pat. No. 11,817,824.

(51) Int. Cl.
*H03B 5/12* (2006.01)
(52) U.S. Cl.
CPC ......... *H03B 5/1228* (2013.01); *H03B 5/1212* (2013.01); *H03B 5/1243* (2013.01)
(58) Field of Classification Search
CPC ... H03B 5/1228; H03B 5/1243; H03B 5/1212
USPC .......................................... 331/167, 117 FE
See application file for complete search history.

(56) References Cited

U.S. PATENT DOCUMENTS 11,817,824 B1* 11/2023 Ang ................ H03B 5/1228
2013/0181783 A1* 7/2013 Upadhyaya .......... H03B 5/1293
331/117 FE

OTHER PUBLICATIONS

International Search Report and Written Opinion in International Appln. No. PCT/US2023/032776, mailed on Oct. 12, 2023, 6 pages.
Oshmarin et al., "Oscillator Based on Lumped Double Ladder Circuit with Band Edge Degeneracy," Physics, Revised on Mar. 27, 2017, arXiv:1610.00415, 10 pages.
Shen et al. "A Wide-Range Multiport LC-Ladder Oscillator and Its Applications to a 1.2-10.1 GHz PLL," IEEE Transactions on Very Large Scale Integration (VLSI) Systems, Jan. 2015, 23(1): 184-188.

* cited by examiner

*Primary Examiner* — Arnold M Kinkead
(74) *Attorney, Agent, or Firm* — Fish & Richardson P.C.

(57) ABSTRACT

A clock device including: an LC network comprising: a first inductive portion; a second inductive portion connected to the first inductive portion; a third inductive portion connected to the second inductive portion; a first capacitive portion connected to the first, the second, and the third inductive portions; and a second capacitive portion connected to the first inductive portion and the third inductive portion, wherein the LC network is configured to simultaneously resonate at a first frequency and a second frequency that is substantially three times the first frequency, and wherein the clock signal is provided between the first and the third inductive portions by combining a first signal component and a second signal component that is a third harmonic of the first signal component and each inflection point of the first signal component is phase aligned with a corresponding inflection point of the second signal component.

10 Claims, 19 Drawing Sheets

MULTI-RESONANT OSCILLATOR/CLOCK

CLAIM OF PRIORITY

This application is a continuation of U.S. patent application Ser. No. 17/955,975, filed on Sep. 29, 2022, the entire contents of which are hereby incorporated by reference.

TECHNICAL FIELD

The disclosure generally relates to oscillators and clocks on integrated circuit (IC) devices, such as complementary metal-oxide semiconductor (CMOS) devices.

BACKGROUND

Conventional LC oscillators generate a clock signal that is typically a sine wave, i.e., single tone and continuous waveform. For example, an IC device can include an LC tank that couples to a back-to-back CMOS inverter configuration to provide the sine wave clock signal.

SUMMARY

In one aspect, some implementations provide a clock device to generate a clock signal, the clock device including: an LC network comprising: a first inductive portion comprising a first terminal and a second terminal; a second inductive portion comprising a first terminal and a second terminal, wherein the first terminal of the second inductive portion is connected to the second terminal of the first inductive portion; a third inductive portion comprising a first terminal and a second terminal, wherein the first terminal of the third inductive portion is connected to the second terminal of the second inductive portion; a first capacitive portion comprising a first terminal and a second terminal, wherein the first terminal of the first capacitive portion is connected to the second terminal of the first inductive portion and the first terminal of the second inductive portion, and wherein the second terminal of the first capacitive portion is connected to the second terminal of the second inductive portion and the first terminal of the third inductive portion; and a second capacitive portion comprising a first terminal and a second terminal, wherein the first terminal of the second capacitive portion is connected to the first terminal of the first inductive portion, and wherein the second terminal of the second capacitive portion is connected to the second terminal of the third inductive portion, wherein the LC network is configured to simultaneously resonate at a first resonance frequency and a second resonance frequency that is substantially three times the first resonance frequency, and wherein the clock signal is provided between the first terminal of the first inductive portion and the second terminal of the third inductive portion by a combination of a first resonating signal component and a second resonating signal component that is a third harmonic of the first resonating signal component and each inflection point of the first resonating signal component is phase aligned with a corresponding inflection point of the second resonating signal component.

Implementations may include one or more of the following features.

Each inflection point of the resonating signal at the first frequency may coincide with a corresponding inflection point of the resonating signal at the second frequency. The clock signal may have a waveform that is more trapezoidal than those of the resonating signal component at the first frequency and the resonating signal component at the second frequency. The first inductive portion may be characterized by an inductance of Ls/2. The third inductive portion may also characterized by an inductance of Ls/2. The second inductive portion may be characterized by an inductance of Lp. The first capacitive portion may be characterized by a capacitance of Cp. The second capacitive portion may be characterized by a capacitance of Cs. A ratio of Cp/Cs may be substantially fixed when the clock device is tuned over a range of frequencies. Cp and Cs may be variable such that the first frequency is tunable over the range of frequencies while the second frequency remains three times the first frequency.

The first inductive portion may be characterized by an inductance of Ls/2. The third inductive portion may also be characterized by an inductance of Ls/2. The second inductive portion may be characterized by an inductance of Lp. The first capacitive portion may be characterized by a capacitance of Cp. The second capacitive portion may be characterized by a capacitance of Cs. The first frequency may be characterized by:

$$f_1 = \frac{1}{2\pi}\sqrt{\frac{(L_sC_s + L_pC_s + L_pC_p) - \sqrt{(L_sC_s + L_pC_s + L_pC_p)^2 - 4*L_sL_pC_sC_p}}{2*L_sL_pC_sC_p}}.$$

The second frequency may be characterized by:

$$f_2 = \frac{1}{2\pi}\sqrt{\frac{(L_sC_s + L_pC_s + L_pC_p) + \sqrt{(L_sC_s + L_pC_s + L_pC_p)^2 - 4*L_sL_pC_sC_p}}{2*L_sL_pC_sC_p}}.$$

The clock device may further include a gain stage configured to amplify the resonating signal at the first frequency and the resonating signal at the second frequency when the clock signal is generated. The gain stage may include a complementary metal-oxide semiconductor (CMOS) amplifier. The gain stage may include a first pair of complementary transistors and a second pair of complementary transistors. An output node of the first pair of complementary transistors may be separately AC-coupled to input gates of the second paid of complementary transistors. An output node of the second pair of complementary transistors may be separately AC-coupled to input gates of the first pair of complementary transistors. The input gates of the first pair of complementary transistors may be arranged to receive respective bias voltages. The input gates of the second pair of complementary transistors may also be arranged to receive the respective bias voltages.

The first terminal of the first inductive portion may be coupled to a first chip capacitor load. The second terminal of the third inductive portion may be coupled to a second chip capacitor load. The first chip capacitor load and the second chip capacitor load may be coupled to a semiconductor chip or sub-components thereof. The semiconductor chip may include a CMOS system on chip (SOC) device.

The clock device may include an inductive coil having four taps. The first inductive portion may include a first and second tap of the inductive coil. The second inductive portion may include a second and third tap of the inductive coil. The third inductive portion may include a third and fourth tap of the inductive coil.

The first inductive portion may include a first set of winding loops enclosing a first area. The third inductive portion may include a third set of winding loops enclosing a third area. The second inductive portion may include a second set of winding loops enclosing a second area. Surface areas of the first area and the third area may be substantially identical. Electromagnetic effects of the first set of windings on the second set of windings and electromagnetic effects of the third set of windings on the second set of windings may substantially offset each other. A mutual inductive coupling between the first set of winding loops and the second set of winding loops and a mutual inductive coupling between the second set of winding loops and the third set of winding loops may be substantially identical in magnitude, but with opposite signs. The first set of winding loops may be wound in one of: a clock-wise direction or a counter-clockwise direction, while the third set of winding loops may be wound in the other of: a clock-wise direction or a counter-clockwise direction, relative to an interconnected flow of current from the first set of winding loops to the third set of winding loops through the second set of winding loops. When the resonating signal component at the first frequency flows inside the second set of winding loops, the resonating signal component at the first frequency may magnetically induce, in the first set and third set of winding loops, respective currents of substantially identical magnitude that flow in opposing directions, relative to the interconnected flow of current from the first set of winding loops to the third set of winding loops through the second set of winding loops. When the resonating signal component at the second frequency flows inside the first set and third set of winding loops, the resonating signal components flowing in the first set winding loops and the resonating signal components flowing in the third set of winding loops may each magnetically induce, in the second set of winding loops, respective currents substantially identical in magnitude that flow in opposing direction in the third set of winding loops.

The first capacitive portion may include: at least one capacitor bank having two capacitors of substantially identical capacitance that are symmetrically arranged such that one terminal of each of the two capacitors is grounded and the other one terminal of each of the two capacitors is respectively connected to the first and second terminals of the first capacitive portion, wherein the at least one capacitor bank includes at least one switchable capacitor. The first capacitive portion may further include: a voltage controlled capacitor.

The second capacitive portion may include: at least one capacitor bank having two capacitors of substantially identical capacitance that are symmetrically arranged such that one terminal of each of the two capacitors is grounded and the other one terminal of each of the two capacitors is respectively connected to the first and second terminals of the second capacitive portion, wherein the at least one capacitor bank includes at least one switchable capacitor. The second capacitive portion may further include: a voltage controlled capacitor.

In another aspect, implementations may provide clock device to generate a clock signal, the clock device comprising: an LC network comprising: a first inductive portion comprising a first terminal and a second terminal; a second inductive portion comprising a first terminal and a second terminal, wherein the first terminal of the second inductive portion is connected to the second terminal of the first inductive portion; a third inductive portion comprising a first terminal and a second terminal, wherein the first terminal of the third inductive portion is connected to the second terminal of the second inductive portion; a first capacitive portion comprising a first terminal and a second terminal, wherein the first terminal of the first capacitive portion is connected to the second terminal of the first inductive portion and the first terminal of the second inductive portion, and wherein the second terminal of the first capacitive portion is connected to the second terminal of the second inductive portion and the first terminal of the third inductive portion; and a second capacitive portion comprising a first terminal and a second terminal, wherein the first terminal of the second capacitive portion is connected to the first terminal of the first inductive portion, and wherein the second terminal of the second capacitive portion is connected to the second terminal of the third inductive portion, wherein the first inductive portion is characterized by an inductance of Ls/2, wherein the second inductive portion is characterized by an inductance of Lp, wherein the third inductive portion is characterized by an inductance of Ls/2, wherein the first capacitive portion is characterized by a capacitance of Cp, wherein the second capacitive portion is characterized by a capacitance of Cs, wherein the LC network is configured to simultaneously resonate at a first frequency and a second frequency that is three times the first frequency, wherein a ratio of Cp/Cs is substantially fixed when the clock device is tuned over a range of frequencies.

In yet another aspect, implementations provide clock device to generate a clock signal, the clock device comprising: an LC network comprising: a first inductive portion comprising a first terminal and a second terminal; a second inductive portion comprising a first terminal and a second terminal, wherein the first terminal of the second inductive portion is connected to the second terminal of the first inductive portion; a third inductive portion comprising a first terminal and a second terminal, wherein the first terminal of the third inductive portion is connected to the second terminal of the second inductive portion; a first capacitive portion comprising a first terminal and a second terminal, wherein the first terminal of the first capacitive portion is connected to the second terminal of the first inductive portion and the first terminal of the second inductive portion, and wherein the second terminal of the first capacitive portion is connected to the second terminal of the second inductive portion and the first terminal of the third inductive portion; and a second capacitive portion comprising a first terminal and a second terminal, wherein the first terminal of the second capacitive portion is connected to the first terminal of the first inductive portion, and wherein the second terminal of the second capacitive portion is connected to the second terminal of the third inductive portion, wherein the first inductive portion is characterized by an inductance of Ls/2, wherein the second inductive portion is characterized by an inductance of Lp, wherein the third inductive portion is characterized by an inductance of Ls/2, wherein the first capacitive portion is characterized by a capacitance of Cp, wherein the second capacitive portion is characterized by a capacitance of Cs, wherein a first resonating frequency of the LC network is characterized by:

$$f_1 = \frac{1}{2\pi} \sqrt{\frac{(L_s C_s + L_p C_s + L_p C_p) - \sqrt{(L_s C_s + L_p C_s + L_p C_p)^2 - 4 * L_s L_p C_s C_p}}{2 * L_s L_p C_s C_p}},$$

wherein a second resonating frequency of the LC network is characterized by:

$$f_2 = \frac{1}{2\pi}\sqrt{\frac{(L_sC_s + L_pC_s + L_pC_p) + \sqrt{(L_sC_s + L_pC_s + L_pC_p)^2 - 4*L_sL_pC_sC_p}}{2*L_sL_pC_sC_p}},$$

and
wherein the second resonating frequency is substantially three times the first resonating frequency.

The details of one or more embodiments are set forth in the accompanying drawings and the description below. Other aspects, features, and advantages will become apparent from the description, the drawings, and the claims.

DESCRIPTION OF DRAWINGS

Like reference symbols in the various drawings indicate like elements.

DETAILED DESCRIPTION

Figure 1A:
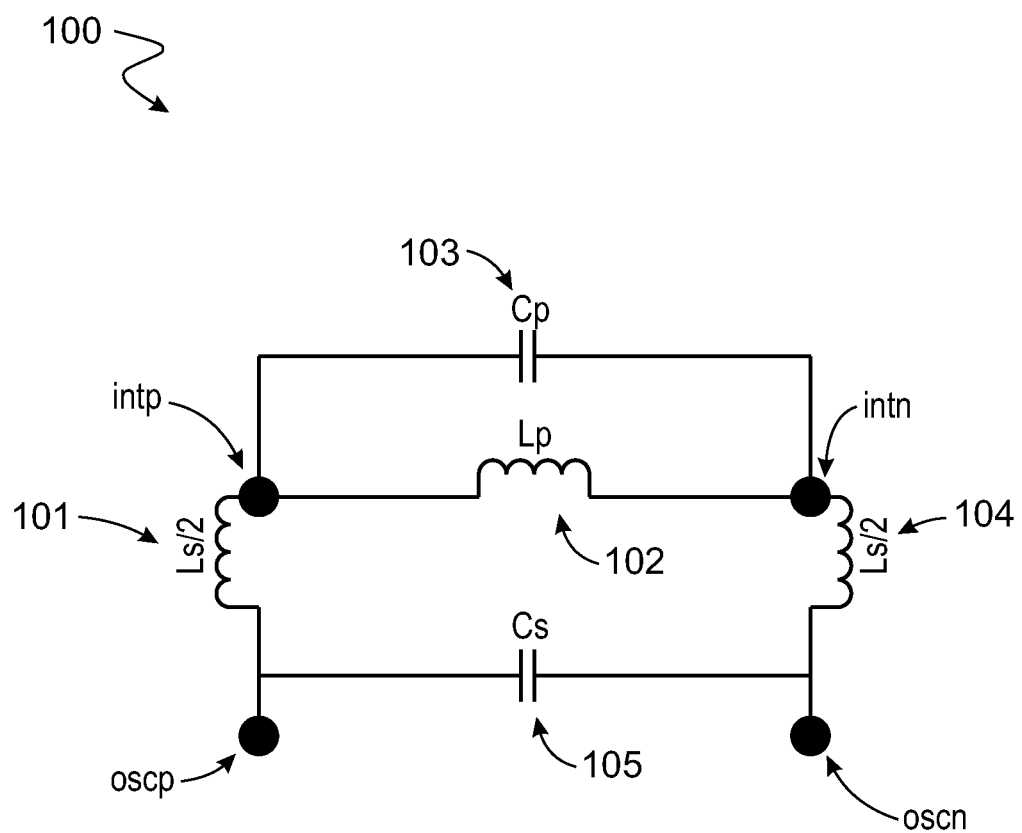
FIG. 1A illustrates an example of an equivalent circuit for a multi-resonant network according to some implementations of the present disclosure.

The clock signal provided by a conventional LC tank is generally sinusoidal and bound in amplitude. However, when a driving complementary metal-oxide semiconductor (CMOS) flip-flops and clock loads in a large CMOS system on chip (SoC), the sinusoidal signal often needs to be sharpened (i.e., modified to have increased slew rates that provide faster rising/falling edges), amplified and re-buffered to provide adequate drive-to-load ratios. The current practice generally incorporates stages of sets of logic gates, inverters, level shifters and other limiting amplifiers to convert the sinusoidal signal to a more trapezoidal waveform for logical operations. Each stage represents a delay, including a deterministic and a random jitter as byproducts of supply and device noises. Each stage may also require a driving current, and hence can introduce added power dissipation on its own. Distributed trees, e.g., H-tree in multiple stages and bifurcations, can involve repeaters, further compounding the undesirable power overhead. Moreover, when a conventional LC tank is employed in a phase-locked loop (PLL) oscillator stage, the limited amplitude and slew rate can negatively impact its phase noise performance, in addition to requiring further amplification and buffering.

Implementations of the present disclosure can leverage a multi-tone LC network configuration on a clock device to provide rail-to-rail (i.e. supply voltage to ground voltage) drive signals in substantially trapezoidal waveforms on site for each end point (e.g., node or terminal) on a large CMOS SoC or sub-components thereof. The implementations can reduce or obviate the clock delay/skew/jitter overhead and significantly reduce the power dissipation. Both the overhead and the dissipation have plagued the current practice for a considerable period of time. The clock device may more efficiently use power by, for example, employing harmonic resonance directly on capacitive clock loads, thus recycling charge between the capacitive load and the reactive components in the multi-tone LC network configuration. The current sourced by a gain stage is reduced to 1/Q of the non-resonant counterpart, where Q is the ratio of the energy stored to energy dissipated for the given supply voltage, and is the proportion of the capacitive or inductive reactance at resonance relative to the dissipative resistance in the LC network's path.

More particularly, by a judicious configuration of the coupled LC components of the multi-tone LC network, the clock device of various implementations can simultaneously resonate at a fundamental frequency ($f_0$) and a third harmonic (i.e., $3f_0$), thereby generating the fundamental frequency ($f_0$) and the third harmonic (e.g., $3f_0$) concurrently. Moreover, where the LC network is coupled to the gain stage, the fundamental frequency ($f_0$) signal is additive and phase aligned with the third harmonic signal because the 0° and 180° transition edges of the fundamental signal coincide with a subset of the 0° and 180° transition edges of the third harmonic signals. As a result, the harmonic summation provides a time-domain waveform that is substantially trapezoidal in shape. In general, the waveform can resemble a buffered CMOS gate output curve. Examples can include a plateau appearance with a ramp-up phase that tracks, for example, a sigmoid function, rather than a sinusoid function. The combined signal is more amenable for directly driving downstream logic devices at CMOS levels, for example, when provided with an appropriately CMOS level gain stage such as back to back inverters or gate-biased derivatives thereof. In particular, the result obviates the need for other components to generate the trapezoidal waveform. Thus, the generated signal can be used directly by the downstream logic devices, i.e., without other modification of the slew rate by other components. The implementations can thus replace a large clock tree with a network of one or more directly driven multi-tone-resonant capacitive loads. In some implementations, multiple distributed instances of the clock device can be connected by low-impedance conductive wiring without intermediary repeaters and amplifiers.

FIG. 1A shows an example of a simplified equivalent circuit 100 for a multi-resonant network according to some implementations of the present disclosure. As explained in more detail below, the multi-resonant network simultaneously oscillates at a fundamental frequency $f_1$ and the 3rd harmonic $f_3$, with the latter at a significantly scaled down amplitude with respect to the former. The multi-resonant network can obtain high slew rate full-voltage-range waveforms at the network's input. By adjusting the capacitor and inductor components, implementations can tune the multi-resonant network to achieve frequency and performance targets. In addition to an LC tank that includes inductive portions 101, 102, 104, and capacitive portions of 103 and 105, as explained below, the equivalent circuit also includes nodes oscp and oscn—representing input nodes on the amplifier side, as well as nodes intp and intn—representing internal nodes.

Figure 5A:
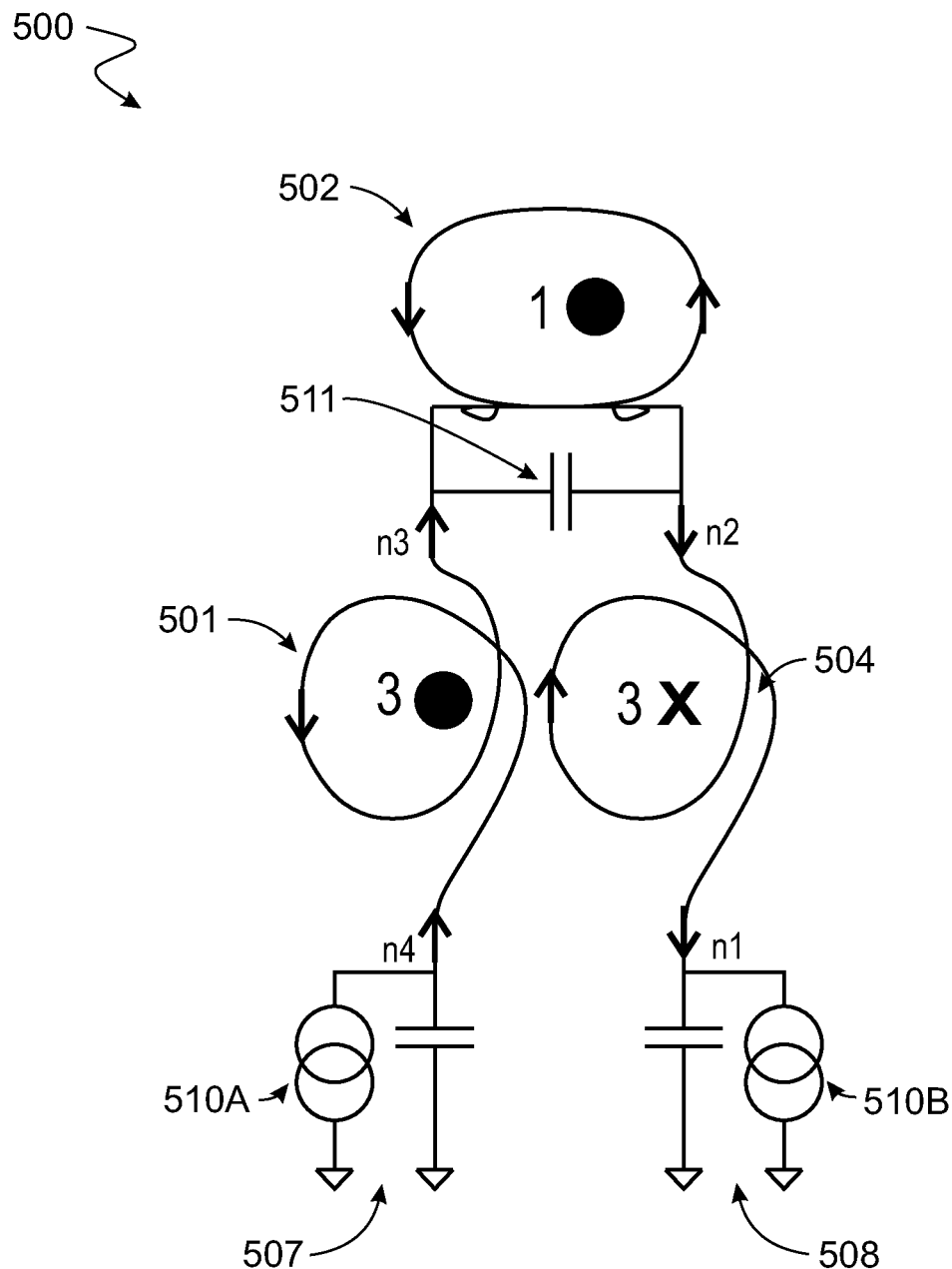
FIGS. 5A and 5B show an example of a physical inductor layout for a multi-resonant network according to some implementations of the present disclosure.
Figure 5B:
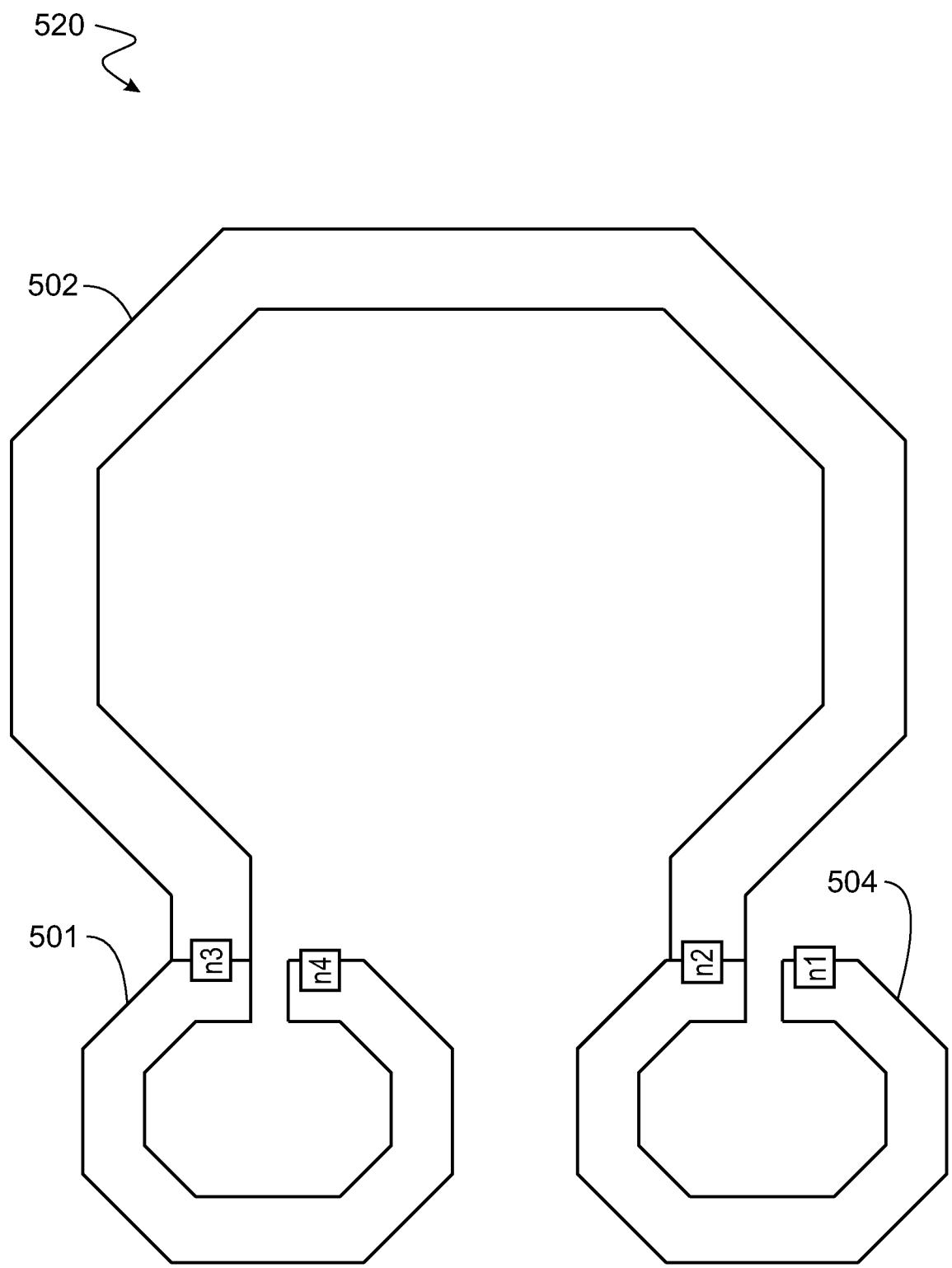

As illustrated, equivalent circuit 100 includes a first inductive portion 101, a second inductive portion 102, and a third inductive portion 104. The first inductive portion 101 and the third inductive portion 104 are both characterized by the inductance of Ls/2. The second inductive portion 102 is characterized by an inductance of Lp. Each inductive portion can be an inductor. In some cases, the three inductive portions are implemented as, for example, a 4-tap inductive coil defined by a total of four nodes, namely, oscp, oscn, intp, intn, as shown in FIG. 1A. By way of examples, each inductive portion can also be implemented by winding one or more loops of an inductive loop coil, as further explained below in association with FIG. 5A. Each loop of the inductive loop coil can be a complete loop, as illustrated in FIG. 5A, or a partially complete loop, such as, for example, an arc as illustrated in FIG. 5B.

The equivalent circuit 100 additionally includes a first capacitive portion 103 and a second capacitive portion 105. Implementations may include the first capacitive portion 103 as a capacitor bank of, for example, two capacitors of identical capacitance in symmetrical arrangement such that one terminal of each capacitor is grounded, while the other terminal of each capacitor is connected to a terminal of the first capacitive portion 103. In this arrangement, the capacitance of each of the two separate capacitors is twice that of the equivalence capacitance (e.g. Cs, as illustrated). The second capacitive portion 105 can be similarly implemented as a capacitor bank of, for example, two capacitors of identical capacitance in symmetrical arrangement. Other examples can incorporate more than two capacitors in symmetric arrangements.

The multi-resonant network's desired response can be expressed in s-domain in terms of the fundamental F(s) and the $3^{rd}$ harmonic H(s) as follows:

$$F(s) = \frac{1}{(s+j)(s-j)} = \frac{1}{s^2+1} \quad (1)$$

$$H(s) = \frac{1}{(s+3j)(s-3j)} = \frac{1}{s^2+9}$$

$$F(s) + k*H(s) = \frac{1}{s^2+1} + \frac{k}{s^2+9} = \frac{(1+k)s^2 + (9+k)}{s^4 + 10s^2 + 9}$$

When operating in parallel resonance, the $Z_{in}$ impedance looking into such a multi-resonant network should approach infinity twice: once at the desired fundamental frequency and once at its 3rd harmonic. It follows that when the s-domain denominator of $Z_{in}(s)$ is nulled, the resulting function should fit the form shown in Equation 1 above. Details of such a network are shown next.

Regarding the multi-resonance example of FIG. 1A, the s-domain input impedance of the circuit can be expressed as:

$$Z_{in}(s) = \frac{L_s L_p C_p s^3 + (L_s + L_p)s}{L_s L_p C_s C_p s^4 + (L_s C_s + L_p C_s + L_p C_p)s^2 + 1}$$

At parallel-resonance, $Z_{in}$ approaches infinity.

$$0 = L_s L_p C_s C_p s^4 + (L_s C_s + L_p C_s + L_p C_p)s^2 + 1$$

Based on the above, the resonant frequencies can be derived as a function of the component values. For example, f can be solved by compound quadratic rooting as follows (noting that $s = j\omega = j2\pi f$).

$$s^2 = \frac{-(L_s C_s + L_p C_s + L_p C_p) \pm \sqrt{(L_s C_s + L_p C_s + L_p C_p)^2 - 4*L_s L_p C_s C_p}}{2*L_s L_p C_s C_p} \quad (2)$$

$$f = \frac{1}{2\pi}\sqrt{\frac{(L_s C_s + L_p C_s + L_p C_p) \pm \sqrt{(L_s C_s + L_p C_s + L_p C_p)^2 - 4*L_s L_p C_s C_p}}{2*L_s L_p C_s C_p}}$$

In Equation 2 above, two solutions arise owing from the "±" above, representing each of the two poles. Without loss of generality, the two solutions, namely, resonant frequencies $f_1$ and $f_2$ can be expressed as:

$$f_1 = \frac{1}{2\pi}\sqrt{\frac{(L_s C_s + L_p C_s + L_p C_p) - \sqrt{(L_s C_s + L_p C_s + L_p C_p)^2 - 4*L_s L_p C_s C_p}}{2*L_s L_p C_s C_p}},$$

and $$f_2 = \frac{1}{2\pi}\sqrt{\frac{(L_s C_s + L_p C_s + L_p C_p) + \sqrt{(L_s C_s + L_p C_s + L_p C_p)^2 - 4*L_s L_p C_s C_p}}{2*L_s L_p C_s C_p}}.$$

As discussed above, the design aim is to target one pole at the fundamental and another pole at the third harmonic. While the above solutions capture a direct and comprehensive relationship, some implementations may use the following approximation for making an initial component choice by inspecting the multi-resonant network's boundary conditions.

For ease of illustration, these implementations may define $f_3$ as the third harmonic of $f_1$, i.e., $$f_3 = 3 * f_1$$

In an ideal circuit, the resonance frequency $f_2$ would be exactly equal to the third harmonic frequency $f_3$, i.e., $$f_2 = 3 * f_1$$

However, the circuit can still operate satisfactorily so long as $f_2 \approx f_3$, e.g., $f_2 = f_3 +/- 10\%$. This is because the circuit has only a single gain cell simultaneously applied to both $f_1$ and $f_3$ that are coupled within the network. Since the singular amplifier's AC gain is applied at the inflection points, any other oscillation mode will not survive, and a 3:1 ratio will be enforced every cycle: the output of the circuit must be a sum of $f_1$ and $f_3$. However, if the $f_1$ and $f_2$ peaks are not exactly a factor of 3 apart, then equilibrium will settle at the non-peak portion of the impedance function (discussed further below with respect to FIG. 2C), thus affecting the amplitude of the third harmonic frequency $f_3$ relative to the amplitude of the fundamental frequency $f_1$ in the output signal.

Figure 1B:
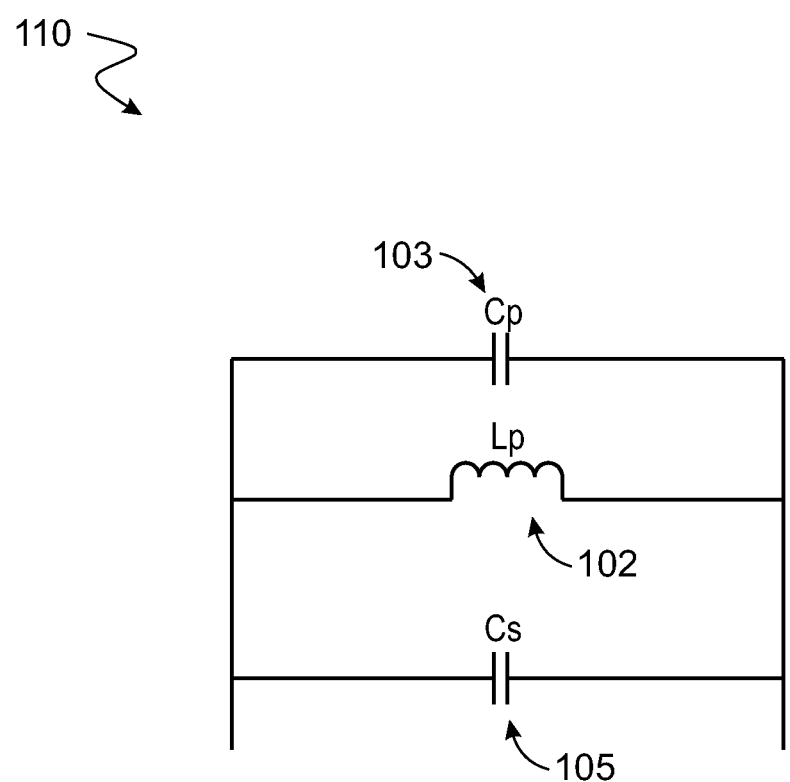
FIG. 1B illustrates the simplified and approximate equivalent circuit of the multi-resonant network of FIG. 1A operating at fundamental frequency.

At the fundamental frequency $f_1$, the series Ls is effectively shorted, as illustrated in FIG. 1B. In the diagram of FIG. 1B, $$f_1 = \frac{1}{2\pi\sqrt{Lp(Cp + Cs)}}.$$

Figure 1C:
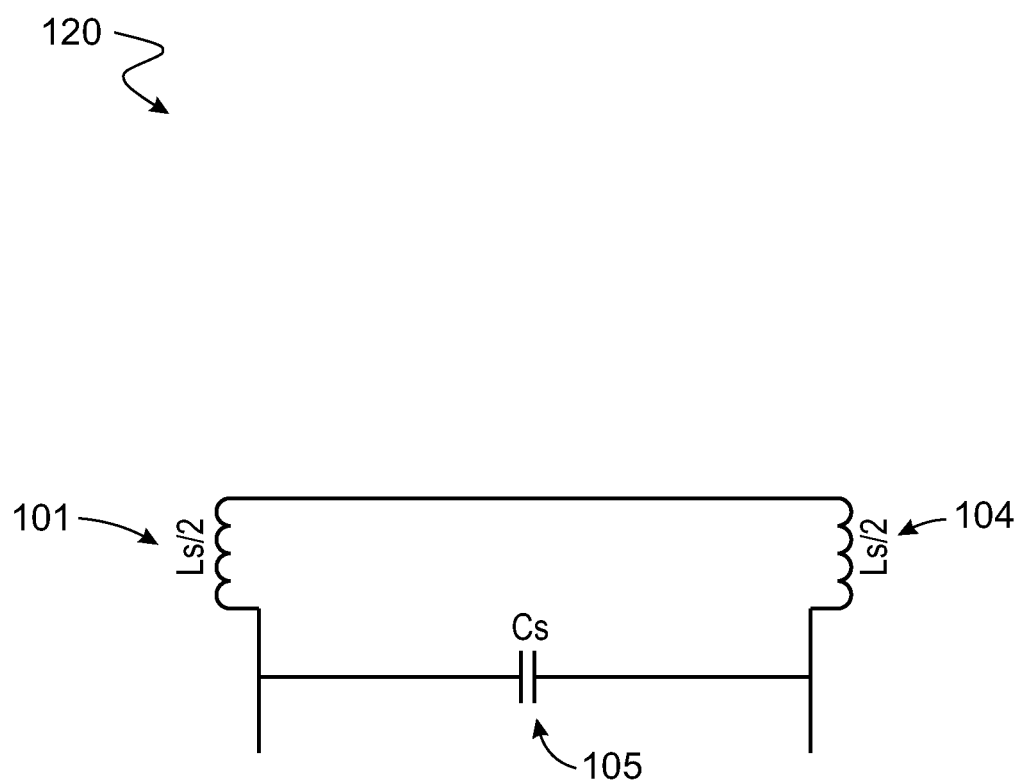
FIG. 1C illustrates the simplified and approximate equivalent circuit of the multi-resonant network of FIG. 1A operating at third harmonic frequency.

At the third harmonic frequency $f_3$, the shunt Cp is effectively shorted, as illustrated in FIG. 1C. In the diagram 120 of FIG. 1C, $$f_3 = \frac{1}{2\pi\sqrt{LsCs}}.$$

Solving the equations for f1 and f3 simultaneously yields, $$\frac{Cp}{Cs} = k\frac{Ls}{Lp} - 1,$$

where k is a heuristic value that includes a ratio of the magnitude of the resonating signal component at the fundamental frequency and the magnitude of the resonating signal at the third harmonic frequency.

The above equation reveals that, when the inductance values for the two inductor elements are given and fixed, Cp/Cs is expected to substantially follow a fixed capacitance ratio governed by the above formula. For example, if switch-connected capacitors are in use to vary the digitally controlled oscillator (DCO) frequency in a phase-controlled loop (PLL) implementation, the "switched" capacitors are expected to follow this Cp/Cs (capacitance) ratio for various settings. As another example, if voltage-controlled capacitors are used to vary a voltage controlled oscillator (VCO) frequency in a PLL, the voltage controlled capacitors likewise are expected to follow this capacitance ratio for various settings. In these examples, the capacitance Cp and the capacitance Cs can be adjusted to tune the fundamental frequency $f_1$ and the resonant frequency $f_2$ so that the multi-resonant network can support an operational frequency range. The tuning involves adjusting, for example, the capacitance Cp and the capacitance Cs in tandem to accommodate the frequency range, and to compensate for process, voltage and temperature variations across chips and operating conditions. However, before, during, and after tuning, the capacitance ratio, i.e., Cp/Cs remains substantially unchanged. In other words, the capacitance ratio of Cp/Cs is substantially fixed.

Figure 1D:
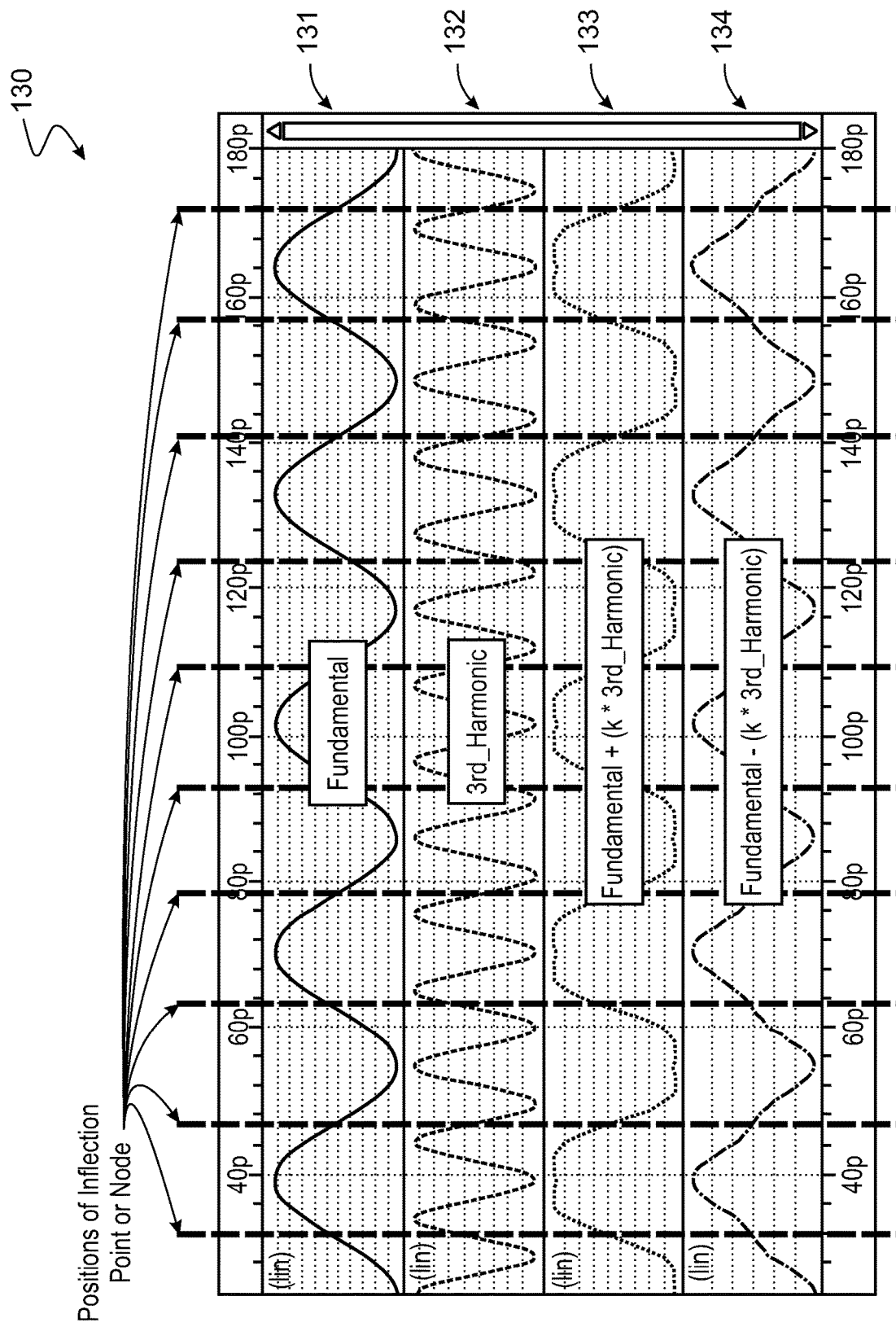
FIG. 1D illustrates examples of ideal waveforms expected of the multi-resonant network of FIG. 1A.

FIG. 1D shows examples of ideal waveforms when sine waves at frequencies of $f_1$ and $f_3$ are mutually added and subtracted, at a magnitude ratio between the sine wave at $f_1$ and the sine wave at $f_3$. Here, the sine wave at frequency $f_1$ has 0° and 180° phase positions (indicated by vertical dashes) that correspond to inflection points or nodes of the sine wave. Each of these phase positions of the $f_1$ signal coincides with a position of the $f_3$ signal with the same phase, as illustrated in FIG. 1D. Such coinciding phase position between an inflection point of the $f_1$ signal and a matching inflection point of the $f_3$ signal is also referred to as phase aligned in this present disclosure. As illustrated, the $f_3$ signal has more inflection points than the $f_1$ signal. Not all the inflection points of the $f_3$ signal are phase aligned with the $f_1$ signal because some inflection points of the $f_3$ signal do not coincide with any inflection point of the $f_1$ signal.

In diagram 130, trace 131 shows an example of a waveform of the resonant signal at the fundamental frequency (i.e., the sine wave at $f_1$ in this example). Trace 132 shows an example of a waveform of the resonance signal at the third harmonic frequency (i.e., the sine wave at $f_3$ in this example). Trace 133 shows expected additive waveform (resulting from Fundamental+(k*$3^{rd}$_harmonic)) at the inputs to the multi-resonant network of FIG. 1A (i.e. between oscp and oscn). Trace 134 shows the expected subtractive waveform (i.e., Fundamental−(k*$3^{rd}$_harmonic)) at the internal nodes of the multi-resonant network of FIG. 1A (i.e. between intp and intn).

In general, the resulting additive waveform can yield a faster transition time, e.g. a rise time that measures the transition of the resulting waveform from 10% to 90% of the full amplitude, relative to a sine wave. The rise time improvement relative to a sine wave can also be measured as the rise time from 20% to 80% of the full amplitude. Such improvement allows the implementations to resonate large clock loads in order to save power. The improved rise time also has a practical advantage of reducing noise. Implementations may achieve a 10-90% rise time, faster than that of a sine wave (measured at 0.29/f where f is the frequency of the signal). In some cases, the rise time can be achieved in, for example, 0.28/f, or 0.27/f or less. For example, the rise time can be in the range of 0.22/f to 0.13/f.

In one illustration, trace 133 demonstrates a rise time of 0.167/f. In the PLL VCO/DCO embodiment resulting in the $2^{nd}$ to $5^{th}$ upper panels of FIGS. 2D and 2E, the 10%-90% rise times can range from approximately 0.17/f to approximately 0.26/f as a function of process, voltage, temperature, frequency and electrical configuration. In the resonant clock load example resulting in the upper panels of FIGS. 3B and 3C, the 10%-90% rise times can range from approximately 0.13/f to approximately 0.22/f as a function of process, voltage, temperature. An application's desired improvement in rise time can depend on factors such as the RC time constant of the clock tree wiring in a specific semiconductor process, or the synchronous clock rate the CMOS loads of the multi-resonant network. On the other hand, a multi-resonant network's actual resulting improvement in rise time can depend on a number of factors, for example, the quality factor (Q) of the network and its components, parasitic variations in components within the network's path, the gain and linearity of the gain stage, and process/voltage/temperature variations.

Figure 2A:
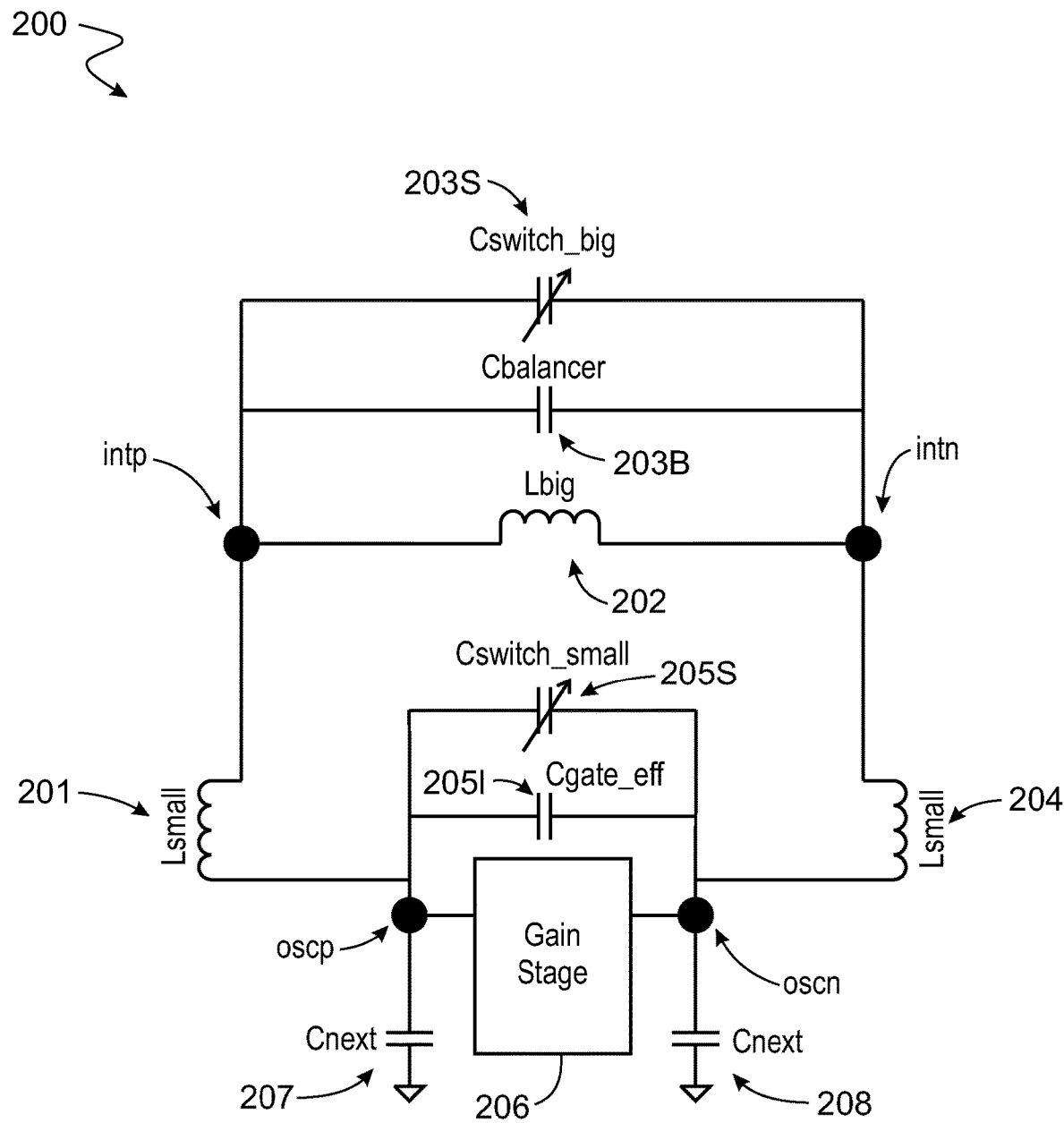
FIG. 2A shows another example of an equivalent circuit for a multi-resonant network according to some implementations of the present disclosure.

FIG. 2A adds more details to FIG. 1A according to some implementations of the present disclosure. As depicted in diagram 200, the multi-resonant network includes inductor 201, inductor 202, and inductor 204. Inductors 201 and 204 are each configured to have an inductance of Ls/2, while inductor 202 is configured to have an inductance of Lp. In some cases, the three inductors can be implemented as a 4-tap inductive coil. By way of examples, each inductor can also be implemented by winding one or more loops of an inductive loop coil, as further explained below in association with FIGS. 5A and 5B.

The multi-resonant network additionally includes capacitors 205I and 205S as well as capacitors 203B and 203S. In various configurations, capacitors 205S and 203S have switchable capacitance, and hence are adjustable. The implementations may incorporate a capacitor bank for each schematic capacitor. For example, each schematic capacitor can be implemented as two or more ganged capacitors of identical or different capacitance in symmetrical arrangement with one terminal of each capacitor being grounded. In this particular example of FIG. 2A, Cp/Cs~1.67, and Lp/Ls~1.79.

As illustrated in diagram 200, the multi-resonant network can be coupled to a differential non-linear amplifier such as gain stage 206 with coupling capacitors 207 and 208. Additionally or alternatively, non-looped CMOS drivers may also couple to the multi-resonant network. In any event, diagram provides an example of a square-like wave oscillator, as distinguished from sine-like wave when utilizing a regular single-pole resonant network. When low-resistance switched L and/or switched C networks are incorporated, such as when coupled to back-to-back CMOS inverters or the like, a wide-range PLL or a multi-range high-slew-rate high-frequency clock driver may be formulated. Using the illustrated multi-resonant network, some implementations can operate without using a long clock tree that follows the multi-resonant network because the waveform of the clock signal is already trapezoidal, and capable of driving a large capacitance such as a large driver-stage's gate load.

Figure 2B:
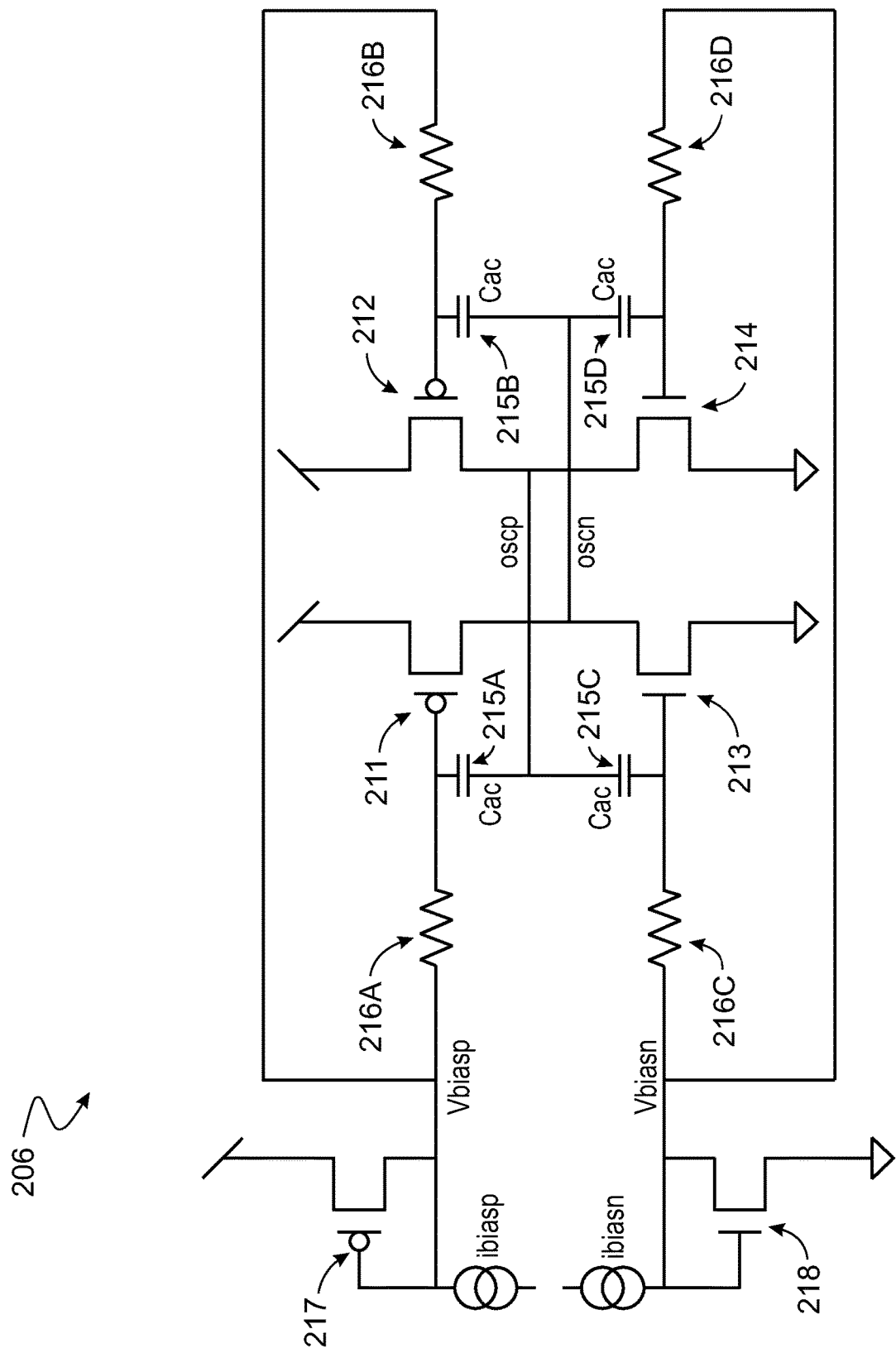
FIG. 2B shows an example of a gain stage for the multi-resonant network of FIG. 2A.

FIG. 2B illustrates an example of a differential gain-stage for gain stage 206 of FIG. 2A. This example of gain stage is configured using gate-biased back-to-back inverters. The terminals oscp and oscn, which represent a differential output, correspond to the same terminals noted around gain stage 206 in FIG. 2A. As illustrated, transistors 211, 212, 213, and 214 form a differential amplifier along with coupling capacitors 215A, 215B, 215C, 214D and shunt resistors 216A, 216B, 216C, and 216D. Additionally, transistor pair 217 and 218 generate biasing voltages Vbiasp and Vbiasn corresponding to biasing currents ibiasp and ibiasn. As illustrated, the input gates of transistors 211 and 213 are ac-coupled to terminal oscp, arranged as an output node on transistors 212 and 214. Similarly, the input gates of transistors 212 and 214 are ac-coupled to terminal oscn, arranged as an output node on transistors 211 and 213. In this example of a self-compensating configuration, crowbar current can track bias current ibiasp and ibiasn across process, voltage and temperature variables. In this example, shunt impedance and gain can be kept relatively high, when compared to other implementations without using the gate-biased inverters.

In various implementations, the multi-resonant network may directly connect to CMOS gates. As such, inductor switches can break the loop to enter power down mode, allowing static parking of the nodes to known CMOS levels. Upon power up, the switches need only to reengage. Beyond this point, no special start-up circuitry is needed given CMOS initial voltages at the input of the network. Moreover, no known chaotic modes may exist.

Figure 2C:
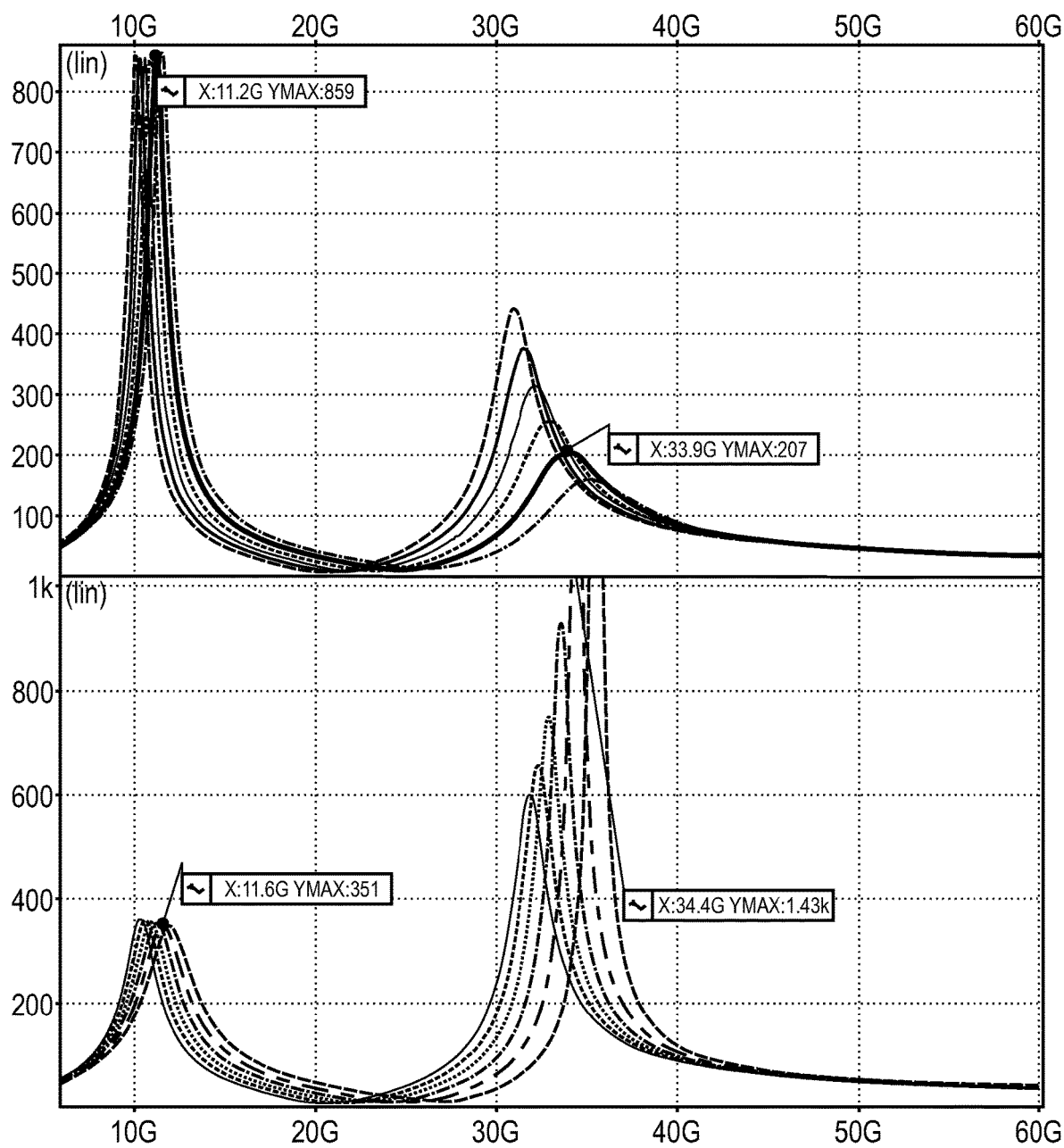
FIG. 2C shows an example of simulated AC impedance (in ohms) as a function of frequency (in MHz) of the multi-resonant network of FIG. 2A.

FIGS. 2C to 2G show various examples of configuring capacitance and inductance of the multi-resonant network of FIG. 2A. FIG. 2C shows the results of simulated shunt resonance impedance (vertical axis in units of "ohms" (Ω)) when sweeping between around 11 GHz and around 33 GHz (horizontal axis) continuously with configurable C where Cp/Cs is about 5/3, and Lp/Ls is about 7/4; the different curves represent different values for the Cp/Cs ratio. In the simulation, the back-to-back inverter oscillator of the gain stage is closed (i.e. self-driven). As demonstrated, the multi-resonance behavior is maintained (e.g., the simultaneous presence of the fundamental and third harmonic) as the capacitance parameter is altered. The top panel shows the AC impedance for $f_1$ and $f_3$ at the highest gain operating point given one best case corner while the lower panel shows the worst case example during simulations.

FIG. 2C, for example, illustrates the resonance peaks for $f_1$ and $f_3$ are not impulse response functions that are infinitely narrow. Instead, the resonance peaks are broad enough to encompass a finite width. Thus, a deviation (e.g., a 10% deviation) of the resonance frequency $f_2$, i.e., the right-hand peak in the graph, from the intended multiple of three (3) times the fundamental frequency $f_1$, i.e. the left-hand peak in the graph, can still promote shunt resonance to improve the rise time of the resulting waveform. When the quality factor Q of the multi-resonant network is lower than shown in FIG. 2C, the resonance peaks can be even broader.

Implementations involve only one gain cell for simultaneous operation on both $f_1$ and $f_3$ resonance signals that are coupled within the network. Because the singular amplifier's AC gain is applied at the inflection points, a 3:1 frequency ratio can be enforced every cycle with respect to a singular frequency component within the spectral width for $f_1$, and a corresponding singular frequency component within the spectral width for $f_3$, as shown in FIG. 2C. In other words, the Cp/Cs ratio, as explained above, need not be precisely fixated at an exact ratio, but can vary but remain within, for example, 10-20% around a given ratio. Stated differently, the Cp/Cs ratio only need to be substantially fixed. As illustrated, the $f_1$ and $f_2$ peaks of FIG. 2C may not be exactly a factor of 3 apart, but multi-resonant equilibrium can settle at the non-peak portion of FIG. 2C. This less-than-ideal situation still results in improved rise times compared to a sinusoid, as illustrated by the best case corner transient waveforms of FIG. 2D versus the worst case corner transient waveforms of FIG. 2E (top panels representing v(oscp-oscn). As discussed below, although both corners exhibit variations from the perfect 3 ratio, along with many other parametric differences included in the simulations, both figures still represent rise times sharper than those from sine waves. Implementations may generate waveforms capable of lingering at rail voltages longer than do sine waves. In these implementations, the rail-to-rail settling voltages are on par with those for CMOS clock signals. not that of a sinusoid whose peak voltages constitute a very small portion of the waveform. The implementations are thus capable of resonating large clock loads to save power. Such capability also gives rise to a practical advantage of reducing noise.

Figure 2D:
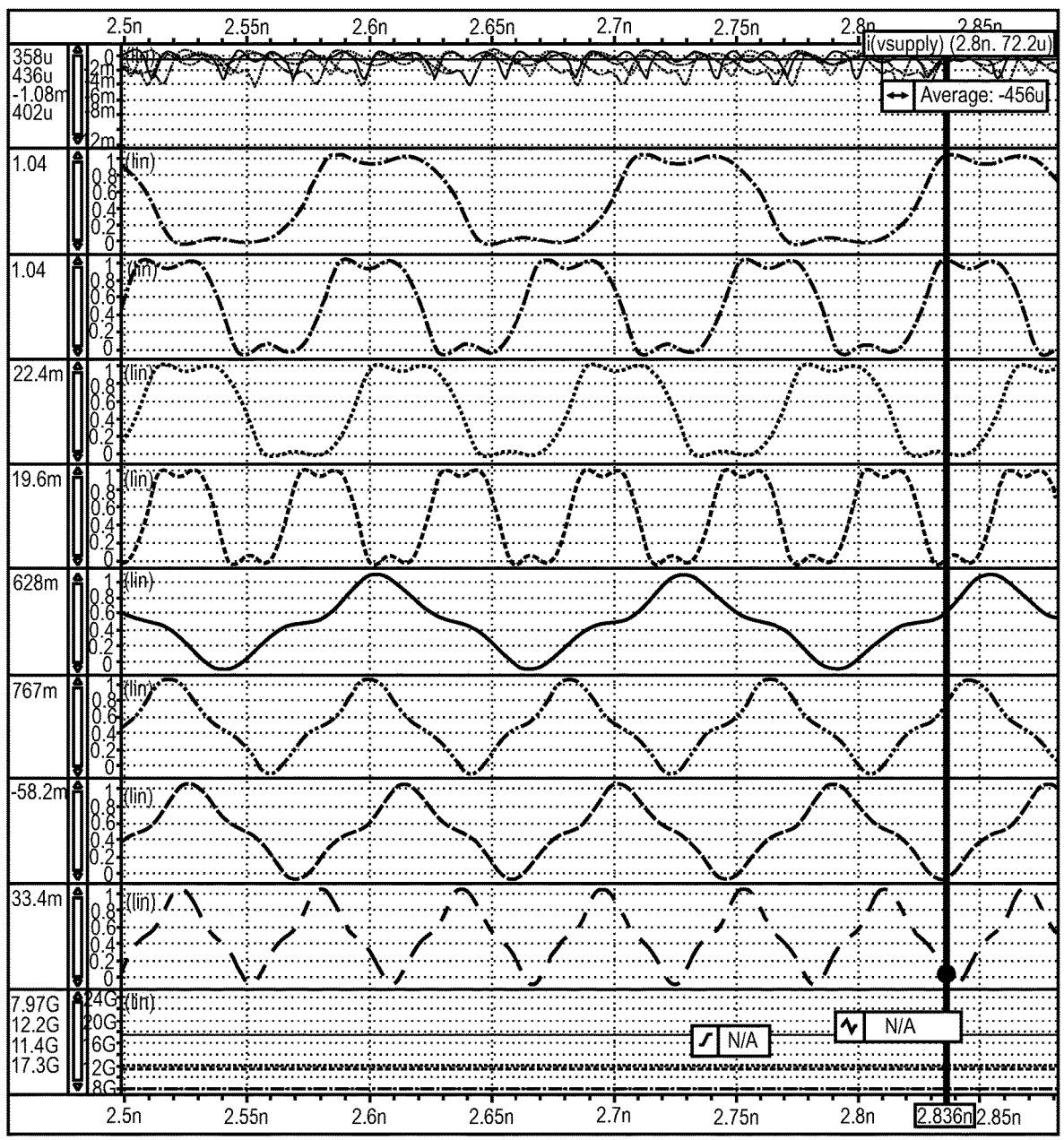
FIG. 2D shows examples of simulated time domain waveforms obtained from the multi-resonant network of FIG. 2A.

FIG. 2D shows the corresponding temporal results of transient waveforms obtained from simulations representing one extreme process, voltage and temperature corner. Various capacitor values were used, culminating in various fundamental frequencies and corresponding $3^{rd}$ harmonics. Notably, the square-like waveforms are obtained at the amplifier side (e.g., the oscp and oscn nodes of FIG. 2A). The triangle-like waveforms are obtained from the internal nodes of multi-resonant network of FIG. 2A (e.g., the intp and intn nodes). In various implementations, the multi-resonant network contains input nodes (e.g., oscp and oscn) as well as internal nodes (e.g., intp and intn). The input nodes sum the first and third harmonics in phase (i.e. the fundamental's rising edges align with a subset of the $3^{rd}$ harmonic's rising edges, and the fundamental's falling edges align with a subset of the $3^{rd}$ harmonic's falling edges). In contrast, the internal nodes sum the first and third harmonics out of phase (i.e. the fundamental's rising edges align with the $3^{rd}$ harmonic's falling edges, and the fundamental's falling edges align with the $3^{rd}$ harmonic's rising edges).

Figure 2E:
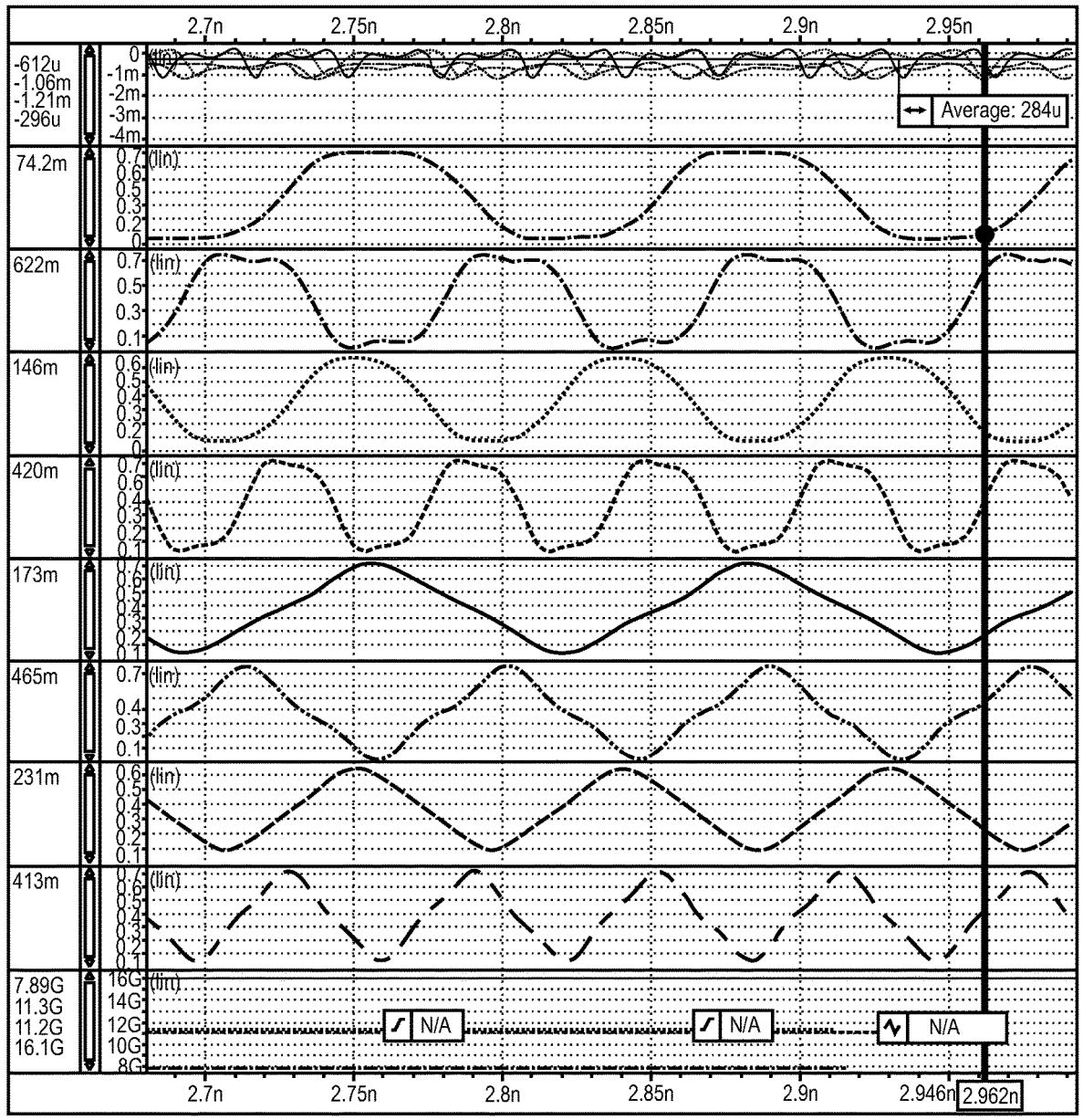
FIG. 2E shows additional examples of simulated time domain waveforms obtained from the multi-resonant network of FIG. 2A.
Figure 2F:
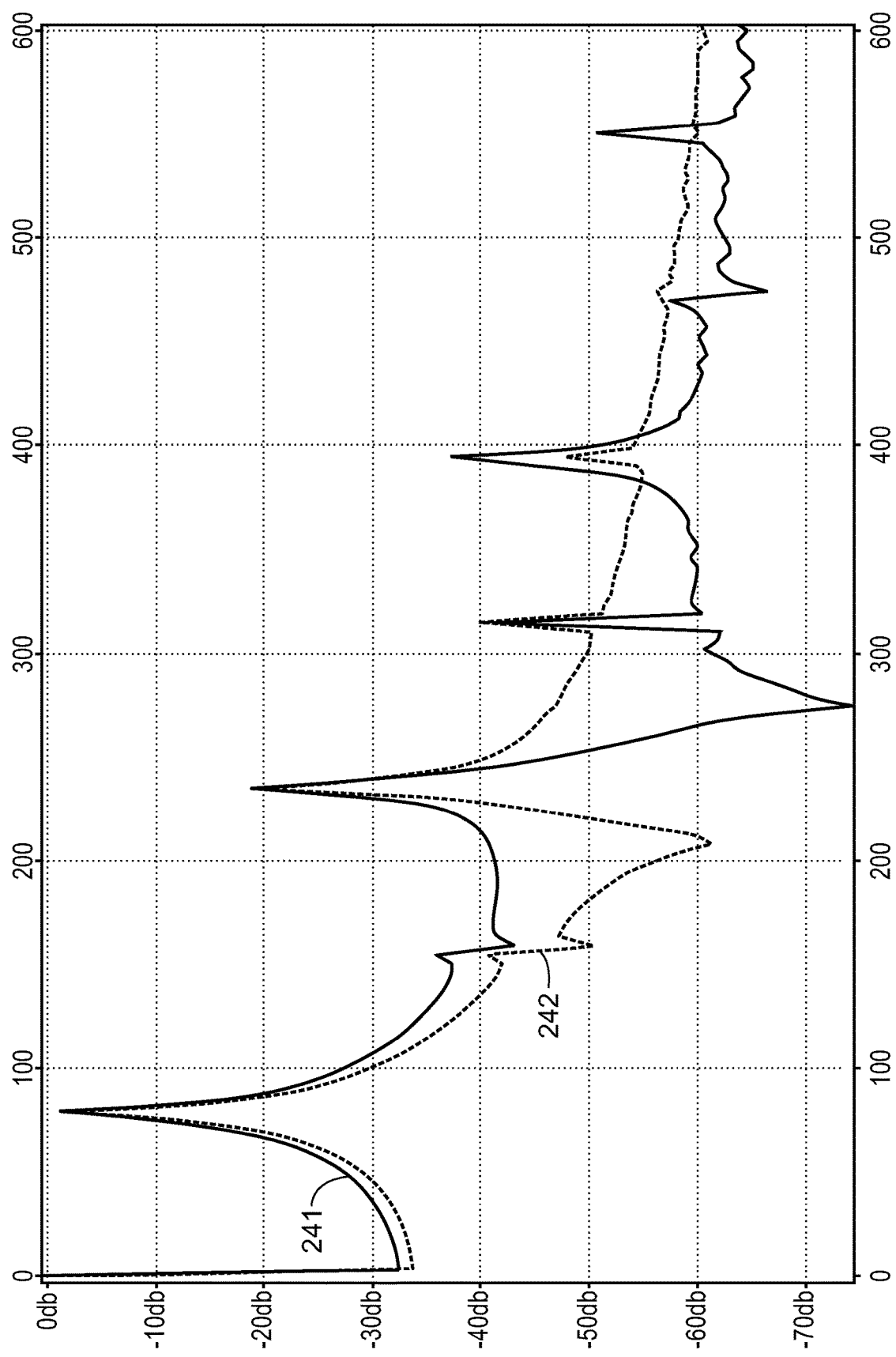
FIGS. 2F and 2G show examples of frequency domain spectra obtained from the time domain simulations of the multi-resonant network of FIG. 2A.
Figure 2G:
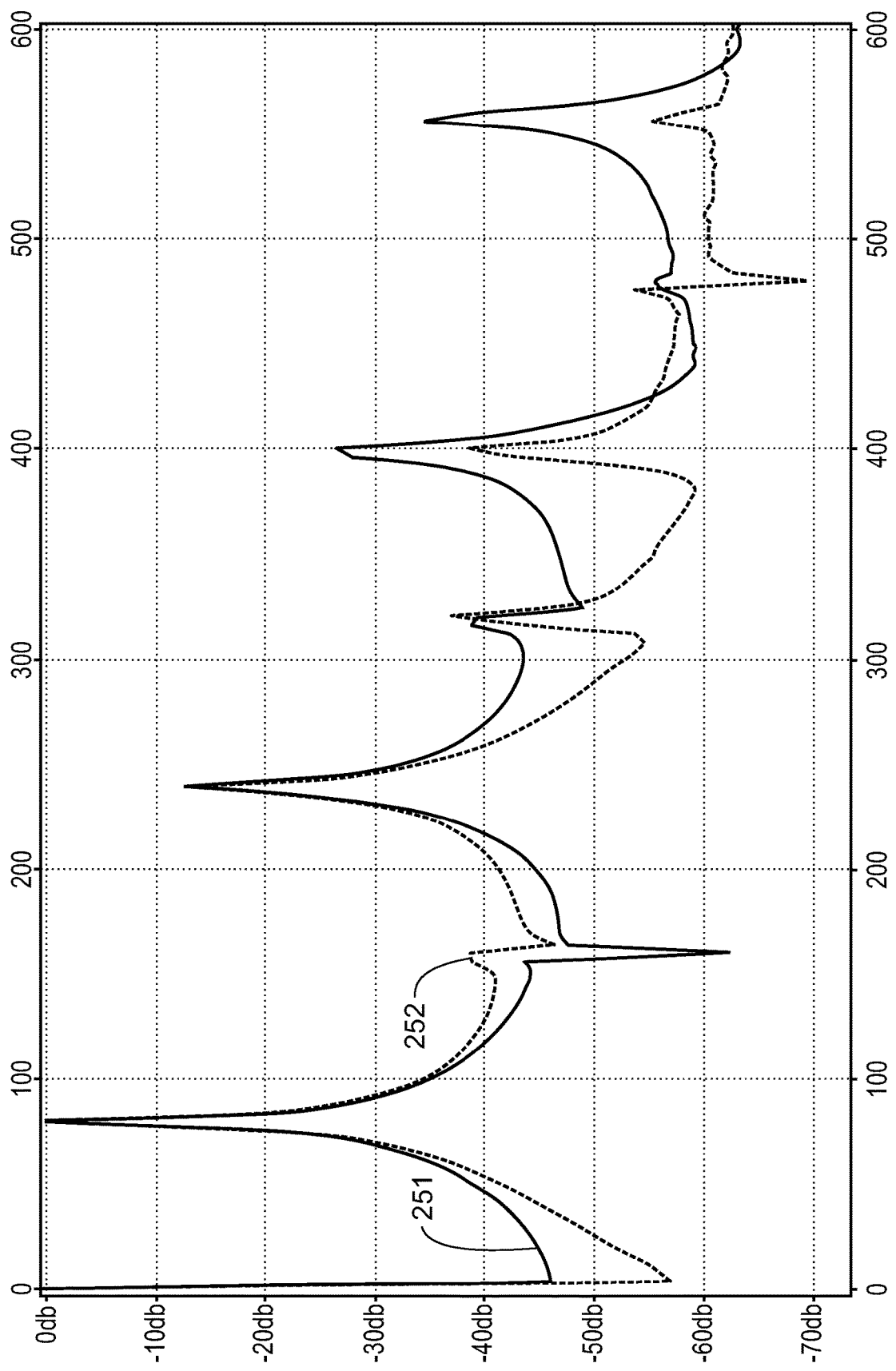

FIG. 2E shows corresponding transient waveforms obtained from simulation representing another extreme process, voltage and temperature corner. FIG. 2F shows the result of fast fourier transform (FFT) of the transient waveforms of FIG. 2D while FIG. 2G shows the results of FFT of the transient waveforms of FIG. 2E. Curves 241 and 251 are taken from the amplifier side (i.e. nodes oscp or oscn) while curves 242 and 252 are taken from the internal side (i.e. nodes intp or intn).

Figure 3A:
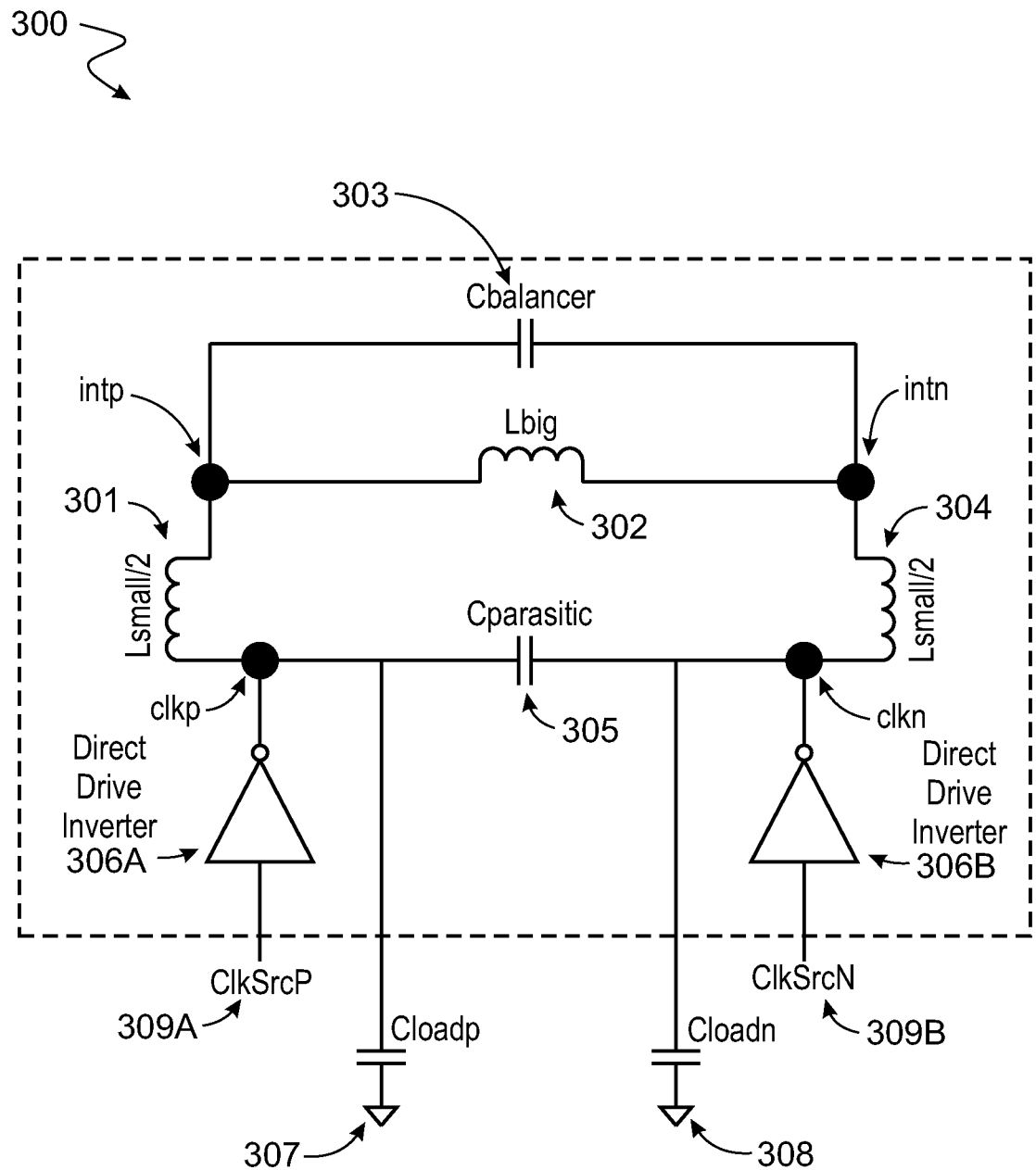
FIG. 3A shows yet another example of an equivalent circuit for a multi-resonant network according to some implementations of the present disclosure.

FIG. 3A shows an example of a schematic 300 for direct drive of the final clock loads of a system on chip (SoC) configuration or sub-components thereof. The SoC configuration or components thereof can include thousands of synchronous gate (e.g. flip-flop) clock input pins and the grid connecting the input pins. The multi-resonant network includes: inductors 301, 302, and 304, as well as capacitors 305 and 303 in similar arrangement as those from FIGS. 1A and 2A. As explained above, the three inductors can be implemented as a 4-tap inductive coil. By way of examples, each inductor can also be implemented by winding one or more loops of an inductive loop coil, as further explained below in association with FIGS. 5A and 5B. The implementations may incorporate a capacitor bank for each schematic capacitor implemented as, for example, two or more capacitors in symmetrical arrangement with respect to each terminal of capacitors 305 or 303. In this example, amplifiers 306A and 306B are configured in direct drive mode to drive the LC tank. As illustrated, amplifiers 306A and 306B can be driven by clock signals 309A and 309B, which can be CMOS clock sources in complementary format. The clock signals 309A and 309B can come from a phase-locked loop (PLL). As illustrated, load capacitors 307 and 308 represent the lumped clock loads, which are balanced in this illustration. Implementations using the illustrated multi-resonant network can accommodate a significantly increased lumped clock loads when compared to implementations without the illustrated multi-resonant network.

When the input of the multi-resonant network is in shunt with the input of other blocks, the example enables direct drive of high-capacitance CMOS gate loads in the same voltage domain. Such a system exhibits very low phase noise and power consumption. This enables deprecation of clock amplification trees, thus improving deterministic jitter and reducing distribution skew while minimizing clock power transients (since the large clock loads are part of the multi-resonant network which recycles charge rather than sourcing/sinking through power/ground in each cycle).

This illustrated example involves non-continuously configurable C and discretely switched L where Cp/Cs is about 1, and Lp/Ls is approximately 0.64. The simulation assumes the component values of: Ls=17.4 pH, Cs=300 fF, Lp=27.2 pH, Cp=300 fF.

Referring to FIGS. 3B to 3E, the results demonstrate the summation of fundamental frequency and a third harmonic based on solving Equation 2 using time domain network simulations. In practice, Ls and Lp are increased by about 16% in practice to compensate for active CMOS driver effects, and series damping elements that are not included in the ideal s-domain analysis. Such increase can also sharpen slew rates. As demonstrated, the ratios are still preserved. The waveforms obtained from simulations include power-down switches that enable CMOS-level power down outputs (i.e., interrupted LC loop), and allows zero-wait oscillation upon switch closure. Switched inductors at lower frequency may see residual capacitances, hence less ideal waveforms.

Figure 3B:
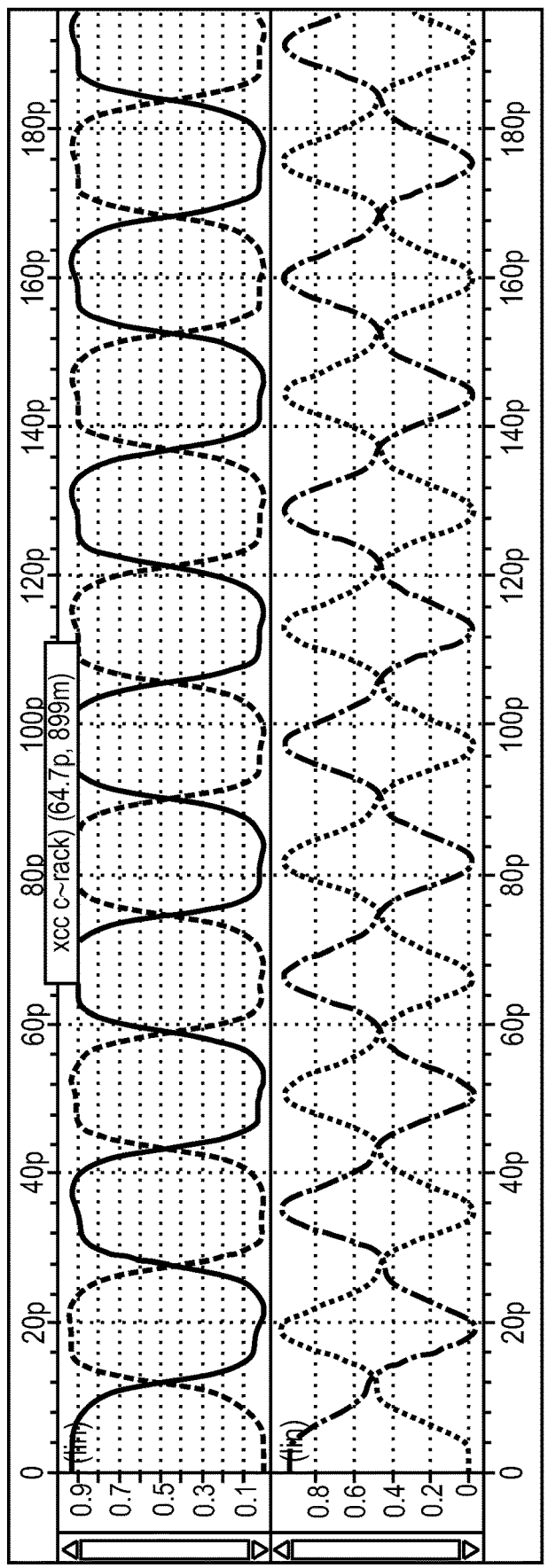
FIGS. 3B, 3C, 3D and 3E show examples of simulated waveforms and spectra obtained from the multi-resonant network of FIG. 3A.
Figure 3C:
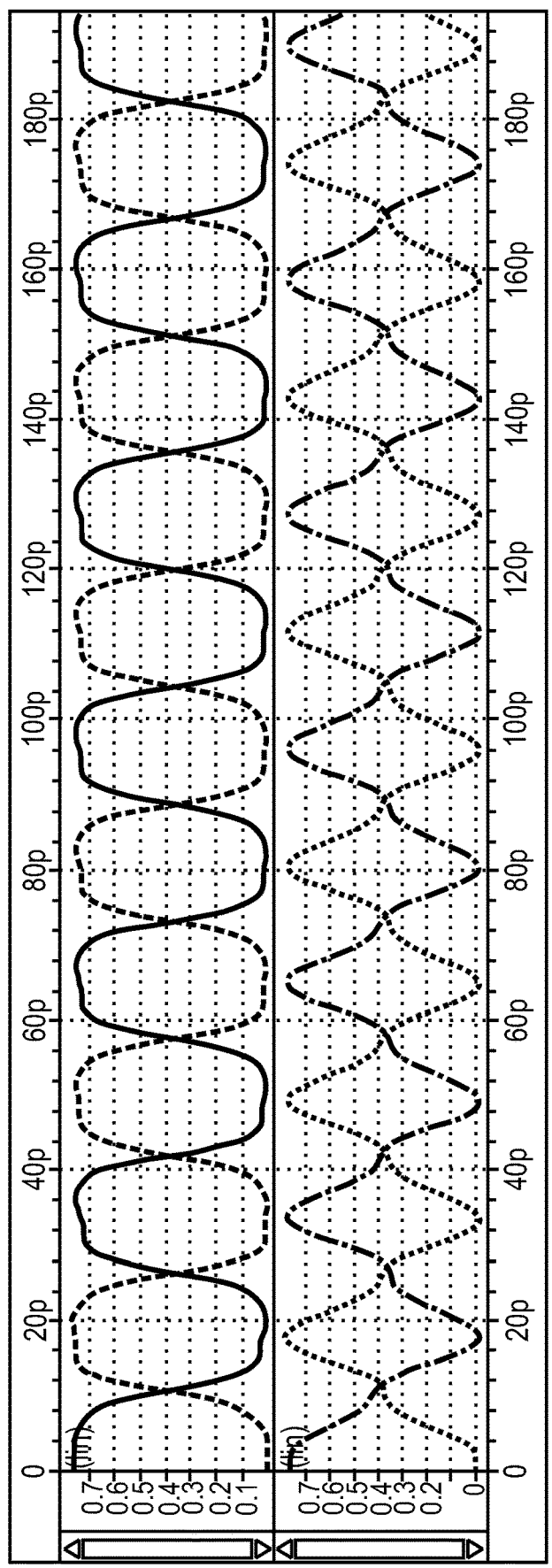

FIG. 3B shows examples of transient waveforms obtained from simulation representing one extreme process, voltage and temperature corner where the load per pin is about 0.73 pF. Notably, the square-like waveforms are obtained at the amplifier side (i.e., clkp or clkn). The triangle-like waveforms are obtained from the internal nodes of multi-resonant network of FIG. 3A (i.e. intp or intn). FIG. 3C shows examples of transient waveforms obtained from simulation representing an opposite extreme of the process, voltage and temperature corner where the load per pin is also about 0.73 pF. In both FIGS. 3B and 3C, the fundamental frequency is at 32 GHz and a third harmonic at 96 GHz.

Figure 3D:
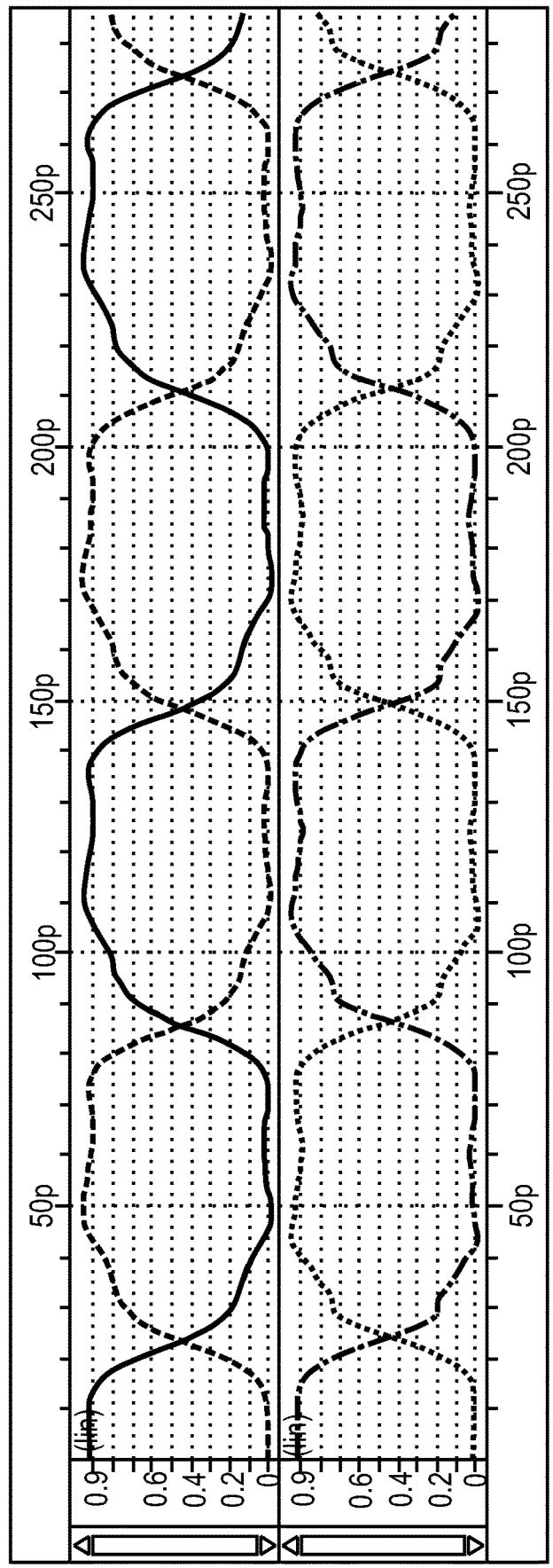
Figure 3E:
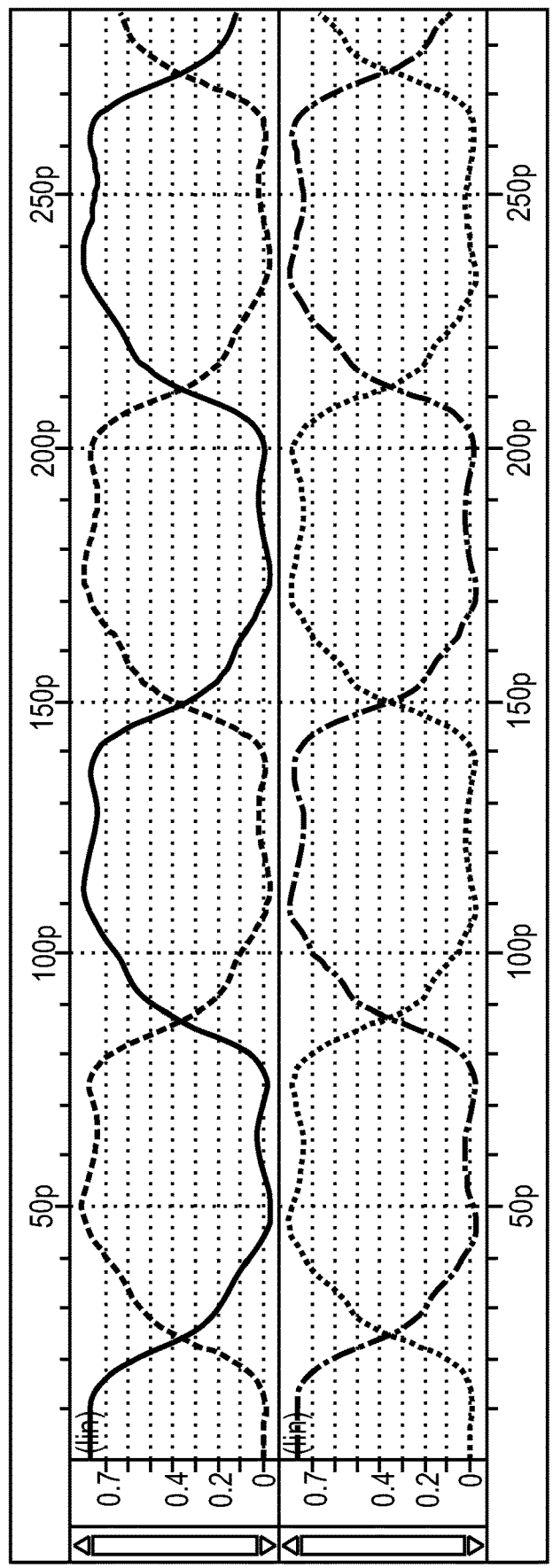

FIGS. 3D and 3E demonstrate results when the inductor switches are disabled, resulting in a broken resonance loop. FIG. 3F shows examples of transient waveforms obtained from simulation representing a best case example where the load per pin is about 0.73 pF. FIG. 3G shows examples of transient waveforms obtained from a worst case example during simulations. The upper panel waveforms are obtained at the amplifier side (i.e., by the output of inverters 306A and 306B). The lower panel waveforms are obtained from the internal nodes of multi-resonant network of FIG. 3A. As the primary resonance loop is broken, the summation of fundamental and $3^{rd}$ harmonics no longer occurs, and so goes the square-like waveform versus triangular waveform distinction between the upper and lower panels of FIG. 3D or 3E. The waveforms' overshoots and undershoots are a consequence of the disjointed inductor loops still coupled to their previously-attached capacitances, causing parasitic LC oscillations.

Figure 4:
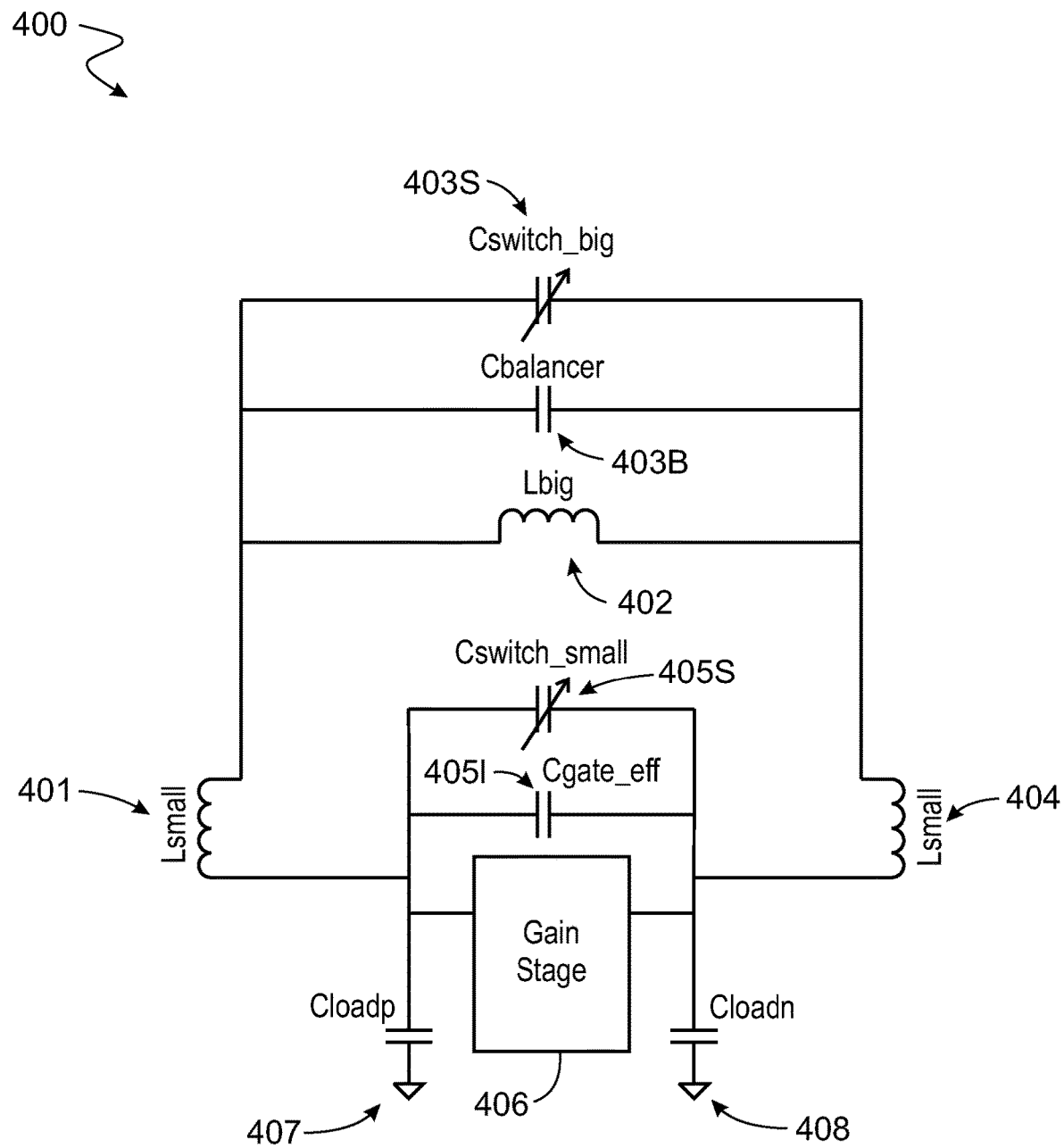
FIG. 4 shows still another example of an equivalent circuit for a multi-resonant network according to some implementations of the present disclosure.

FIG. 4 is a diagram 400 showing yet another example of a multi-resonant network according to some implementations of the present disclosure. As illustrated, diagram 400, similar to diagram 200, also depicts a multi-resonant network that includes inductor 401, inductor 402, inductor 404, capacitors 4051 and 405S and capacitors 403B and 403S. In various configurations, capacitors 405S and 403S have switchable capacitance, and hence are adjustable. In this example, a phase locked loop's oscillator based on gain stage 406 directly drives loads so that the load capacitors 407 and 408, which represent significant chip loads, become part of the oscillator. As with diagram 200, diagram 400's variable capacitor frequency control may incorporate a continuously variable voltage controlled capacitor to implement a voltage controlled oscillator component, or capacitances may be switched with fine capacitance resolution as a digitally controlled oscillator component of a phase locked loop. As such, the phase locked loop feature of diagram 200 combines with the direct drive feature of diagram 300's significant capacitive loads.

FIG. 5A shows diagram 500 depicting an example of a physical inductor layout for a multi-resonant network according to some implementations of the present disclosure. As illustrated, the multi-resonant network, similar to those illustrated in diagrams 200, 300, and 400 also includes inductor 501 (which can provide inductor 201, 301, 401), inductor 502 (which can provide inductor 202, 302, 402), inductor 504 (which can provide inductor 204, 304, 404), along with load capacitors 507 (which can provide capacitor 207, 307, 407) and 508 (which can provide capacitor 208, 308, 408), and internal node capacitor 511.

Although the switchable capacitors are not shown, diagram 500 highlights the physical topology of using inductive coils for realizing inductor 501, inductor 502, and inductor 504. In particular, in the interest of, for example, maximizing the quality factor Q at their respective resonant frequencies, inductors 501, 502 and 504 can be implemented using top metal layers in parallel forming single-turn loops interconnected as depicted in diagram 520 of FIG. 5B, notably without substantial overlap so that mutual inductance can be minimized. In particular, the directions of the winding loops for inductor 501 (between nodes n4 and n3) and inductor 504 (between nodes n1 and n2) are such that magnetic fields are radiated in opposite directions with respect to the coils' plane, thereby reducing $3^{rd}$ harmonic electromagnetic interference (EMI). Significantly, although the single-turn loop is shaped as an arc that forms a partially complete loop, the single-turn loop inductors 501, 502, and 504 are inductive. Additionally, a small but positive mutual inductance results between inductors 501 and 504 owing to the stepped and non-mirrored connection topology with respect to inductor 502 as illustrated in FIG. 5A.

Further referring to FIG. 1A, when Lp (corresponding to inductor 502) resonates at the fundamental frequency, Lp couples magnetically and electrically with each of Ls/2 (corresponding to inductors 501 and 504) only to a minimal degree but predominantly in a mutually opposing direction. Lp therefore presents minimal differential interference to Ls/2. Similarly, further referring to FIG. 1A, when Ls/2 (corresponding to inductors 501 and 504) resonates at the third harmonic frequency, the mutual magnetic and electric fields predominantly counteract each other as seen by the winding loop of inductor 502. Simulation results consequently reveal that the mutually induced currents cancel each other between the $3^{rd}$ harmonic Ls resonance and fundamental Lp resonance, thereby avoiding differential mutual interference. For example, the mutually induced currents can substantially offset each other such that the cancellation is more than 10 dB, or even above 20 dB.

In one example as depicted in FIG. 5B, the mutual inductive coupling coefficient K between inductor 502 (having an inductance of Lp) and inductors 501 and 504 (each having an inductance of Ls/2), is approximately +0.0152 and −0.0154 respectively, which are indeed minimal in value but predominantly opposing each other. In this example, the mutual inductive coupling coefficient K between inductors 501 and 504 remains small at +0.042. Beyond this example of a physical layout, a number of alternative topologies and physical implementations can be easily devised by one familiar with the art.

What has been described is a method for generating a substantially trapezoidal clock signal using a multi-resonant network. Although a number of implementations have been described, it will be understood that various modifications can be made without departing from the spirit and scope of the subject innovation. In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other implementations are within the scope of the following claims.

What is claimed is:

1. A method to generate a clock signal using a clock device, the method comprises:
   configuring an LC network on the clock device as a multi-resonance network that simultaneously resonates at a first resonance frequency and a second resonance frequency that is substantially three times the first resonance frequency;
   synthesizing the clock signal by a combination of a first resonating signal component at the first resonance frequency and a second resonating signal component at the second resonance frequency, wherein each inflection point of the first resonating signal component is phase aligned with a corresponding inflection point of the second resonating signal component; and
   directly driving, using the clock signal, a load coupled to the clock device.

2. The method of claim 1, further comprising:
   simultaneously operating on the first resonating signal and the second resonating signal, using a gain stage on the clock device, such that a ratio of the second resonance frequency over the first resonance frequency is maintained.

3. The method of claim 2, further comprising:
   installing, on the gain stage, a complementary metaloxide semiconductor (CMOS) amplifier that comprises a first pair of complementary transistors and a second pair of complementary transistors;
   arranging an output node of the first pair of complementary transistors as separately AC-coupled to input gates of the second pair of complementary transistors; and
   arranging an output node of the second pair of complementary transistors as separately AC-coupled to input gates of the first pair of complementary transistors; and
   setting input gates of the first pair of complementary transistors to receive respective bias voltages; and
   setting input gates of the second pair of complementary transistors to receive the respective bias voltages.

4. The method of claim 1, wherein the load comprises a CMOS gate load.

5. The method of claim 1, further comprising:
   configuring the LC network to include a first inductive portion, a second inductive portion, a third inductive portion, a first capacitive portion, and a second capacitive portion;
   connecting a first terminal of the second inductive portion to a second terminal of the first inductive portion;

connecting a first terminal of the third inductive portion to a second terminal of the second inductive portion;

connecting a first terminal of the first capacitive portion to the second terminal of the first inductive portion and the first terminal of the second inductive portion;

connecting a second terminal of the first capacitive portion to the second terminal of the second inductive portion and the first terminal of the third inductive portion;

connecting a first terminal of the second capacitive portion to the first terminal of the first inductive portion; and connecting a second terminal of the second capacitive portion to the second terminal of the third inductive portion.

6. The method of claim 5, further comprising:
tuning the clock device over a range of frequencies.

7. The method of claim 6, wherein said tuning comprises:
varying a capacitance Cp that characterizes the first capacitive portion and a capacitance Cs that characterizes the second capacitive portion while substantially fixing a ratio of Cp/Cs.

8. The method of claim 7, wherein the first inductive portion is characterized by an inductance of Ls/2, wherein the second inductive portion is characterized by an inductance of Lp, wherein the third inductive portion is characterized by an inductance of Ls/2, and wherein the first resonance frequency is characterized by:

$$f_1 = \frac{1}{2\pi}\sqrt{\frac{(L_sC_s + L_pC_s + L_pC_p) - \sqrt{(L_sC_s + L_pC_s + L_pC_p)^2 - 4*L_sL_pC_sC_p}}{2*L_sL_pC_sC_p}},$$

wherein the second resonance frequency is characterized by:

$$f_2 = \frac{1}{2\pi}\sqrt{\frac{(L_sC_s + L_pC_s + L_pC_p) + \sqrt{(L_sC_s + L_pC_s + L_pC_p)^2 - 4*L_sL_pC_sC_p}}{2*L_sL_pC_sC_p}}.$$

9. The method of claim 5, further comprising:
coupling the first terminal of the first inductive portion to a first chip capacitor load; and
coupling the second terminal of the third inductive portion to a second chip capacitor load,
wherein the first chip capacitor load and the second chip capacitor load are coupled to a semiconductor chip or sub-components thereof.

10. The method of claim 9, wherein the semiconductor chip comprises a CMOS system on chip (SOC) device.

* * * * *